(12) United States Patent
Hirai et al.

(10) Patent No.: US 8,322,033 B2
(45) Date of Patent: Dec. 4, 2012

(54) METHOD FOR FORMING A CONDUCTIVE POST FOR A MULTILAYERED WIRING SUBSTRATE

(75) Inventors: Toshimitsu Hirai, Hokuto (JP); Tsuyoshi Shintate, Sakata (JP); Jun Yamada, Shiojiri (JP)

(73) Assignee: Seiko Epson Corporation (JP)

( * ) Notice: Subject to any disclaimer, the term of this patent is extended or adjusted under 35 U.S.C. 154(b) by 1121 days.

(21) Appl. No.: 12/206,800

(22) Filed: Sep. 9, 2008

(65) Prior Publication Data

US 2009/0077798 A1    Mar. 26, 2009

(30) Foreign Application Priority Data

Sep. 21, 2007   (JP) ................................. 2007-245305

(51) Int. Cl.
*H01R 43/16*      (2006.01)
(52) U.S. Cl. ............. 29/875; 29/846; 427/273; 438/780
(58) Field of Classification Search ............... 29/830, 29/846, 852, 874, 875, 885; 156/278, 314; 174/261; 427/58, 273, 466; 438/98, 669, 438/675, 780, 783
See application file for complete search history.

(56) References Cited

U.S. PATENT DOCUMENTS

| | | | | |
|---|---|---|---|---|
| 4,539,061 | A * | 9/1985 | Sagiv | 156/278 |
| 6,599,582 | B2 * | 7/2003 | Kiguchi et al. | 427/466 |
| 6,872,512 | B2 * | 3/2005 | Yamashita | 427/273 |
| 7,326,585 | B2 * | 2/2008 | Hirai | 438/99 |

FOREIGN PATENT DOCUMENTS

| | | |
|---|---|---|
| JP | 2003-282561 | 10/2003 |
| JP | 2006-140437 | 6/2006 |

\* cited by examiner

*Primary Examiner* — Donghai D. Nguyen
(74) *Attorney, Agent, or Firm* — Harness, Dickey & Pierce, P.L.C.

(57) ABSTRACT

A method for forming a conductive post include: a) forming a liquid repellent portion having a thickness of 100 nm or less by disposing a liquid repellent material in a conductive post forming region on a conductive layer; b) forming an insulation layer having an opening in a region overlapping with the conductive post forming region by disposing a liquid including an insulation layer forming material on the conductive layer having the liquid repellent portion formed thereon and polymerizing the insulation layer forming material; c) disposing metal particulates in the opening; and d) heating the metal particulates at a fusing temperature of the metal particulates or higher so as to fusion bond the metal particulates to each other in order to form the conductive post, and to fusion bond the metal particulates and the conductive layer in order to couple the conductive post with the conductive layer.

14 Claims, 9 Drawing Sheets

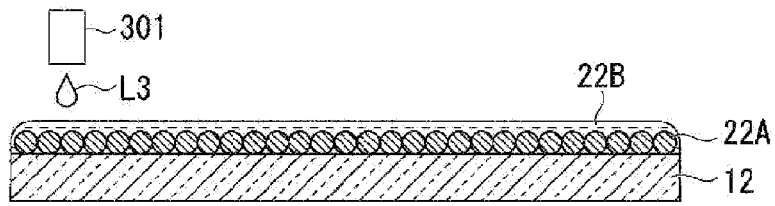
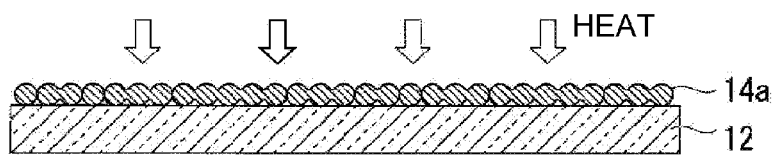
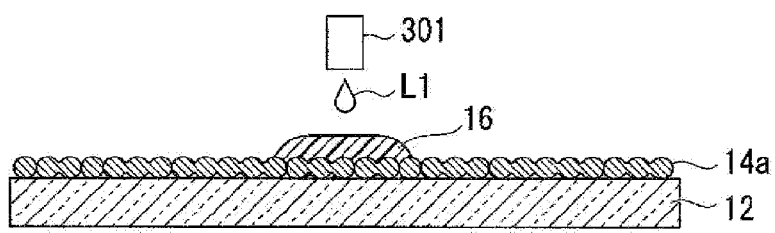
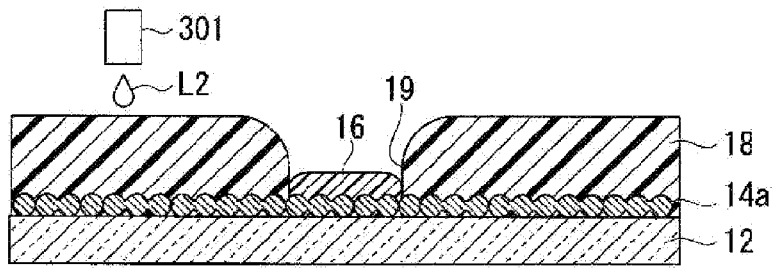
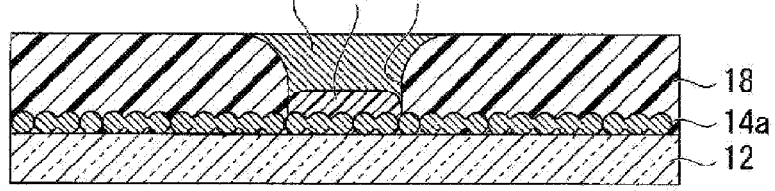
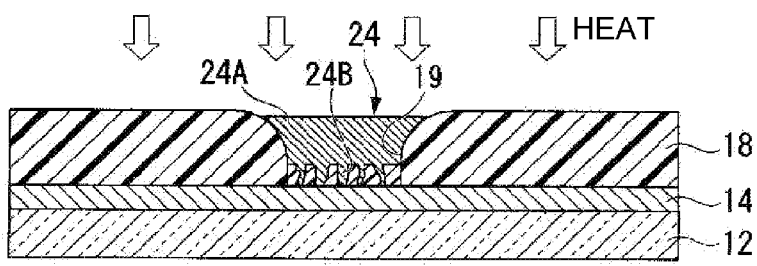

| THICKNESS OF LIQUID REPELLENT PORTION | CONDUCTIVITY BETWEEN CONDUCTIVE POST AND WIRING |
|---|---|
| 1nm | ○ |
| 2nm | ○ |
| 10nm | ○ |
| 50nm | ○ |
| 100nm | ○ |
| 300nm | × |
| 500nm | × |

FIG.12

METHOD FOR FORMING A CONDUCTIVE POST FOR A MULTILAYERED WIRING SUBSTRATE

BACKGROUND

1. Technical Field

The present invention relates to a method for forming a conductive post, a method for manufacturing a multilayered wiring substrate, and a method for manufacturing an electronic apparatus.

2. Related Art

A technique to form a constant material pattern by discharging a liquid containing a desired material so as to be landed on a predetermined position by employing a droplet discharge method (ink-jetting) is now being vigorously developed. Such a patterning technique enables a fine liquid to be applied in a desired position corresponding to resolution of an inkjet head to be used, thereby forming a fine pattern. For example, a fine wiring pattern for a circuit substrate can be formed by applying a wiring material or a solution of the wiring material.

However, such a method is easily affected by a property of a surface to which a liquid is applied. For example, if a portion on which a droplet of the liquid is landed is easy to be wet (lyophilic) with respect to the liquid, the applied droplet may spread out to extend larger than a desired shape. On the contrary, if the portion on which the droplet is landed is hard to be wet (lyophobic) with respect to the liquid, the liquid may agglutinate on the surface to be landed and form a liquid accumulation (bulge), also resulting in not forming a desired shape.

By the way, with response to requirements of down-sized and multi-functioned electronic devices in the market, electronic circuits tend to be highly dense and/or highly integrated. One of the techniques to provide highly integrated electronic circuits is a multilayered wiring structure for circuits. In a circuit having such a structure, an electronic circuit is not only planarly formed, but also vertically formed by layering circuit substrates, successfully providing a highly integrated circuit in a small mounting area. In a case of employing such a multilayered wiring structure, as a method for coupling wiring patterns on layers to each other, a conductive post is formed on an insulation film between the layers so as to couple the layers through the conductive post. When this method is employed, the conductive post to be formed is also required to be minute for a need of a highly dense and/or highly integrated circuit.

As a technique to form the conductive post, JP-A-2003-282561 and JP-A-2006-140437 disclose forming methods employing a droplet discharge method. Specifically, when an interlayer insulation film is formed by applying a liquid containing an insulation film forming material (insulating ink) with the droplet discharge method, a region not having the insulation film is formed by not applying the insulating ink on a conductive post forming region, so that the region not having the insulation film can serve as a conductive post.

However, in the method described above, when the conductive post is formed in a portion having well wettability such as metal wiring or the like, for example, the insulating ink having been applied is easy to spread out other than a desired region, thereby causing difficulty in controlling the conductive post to be in a desired size.

SUMMARY

An advantage of the invention is to provide a method for forming a conductive post superior in controllability for positioning and size. Further, another advantage of the invention is to provide a method for manufacturing a multilayered wiring substrate including a minute conductive post formed by employing the method for forming a conductive post. Yet another advantage of the invention is to provide a method for manufacturing an electronic apparatus including such a multilayered wiring substrate.

A method for forming a conductive post according to a first aspect of the invention includes: a) forming a liquid repellent portion having a thickness of 100 nm or less by disposing a liquid repellent material in a conductive post forming region on a conductive layer; b) forming an insulation layer having an opening in a region overlapping with the conductive post forming region by disposing a liquid including an insulation layer forming material on the conductive layer having the liquid repellent portion formed thereon and polymerizing the insulation layer forming material; c) disposing metal particulates in the opening; and d) heating the metal particulates at a fusing temperature of the metal particulates or higher so as to fusion bond the metal particulates to each other in order to form the conductive post, and to fusion bond the metal particulates and the conductive layer in order to couple the conductive post with the conductive layer.

When the liquid including the insulation layer forming material (insulating ink) is applied so as to cover the conductive layer having the liquid repellent portion formed in the conductive post forming region, the insulating ink is repelled by liquid repellency of the liquid repellent portion. Therefore, the insulation layer having the opening in the conductive post forming region is easily formed. Subsequently, the metal particulates are disposed in the opening formed in the conductive post forming region, and heated at the fusing temperature of the metal particulates or higher so as to fusion bond the metal particulates to each other, thereby forming the conductive post.

Here, the liquid repellent portion formed in the conductive post forming region on the conductive layer is an extremely thin such as a thickness of 100 nm or less. Therefore, when the liquid repellent portion is heated at the fusing temperature of the metal particulates or higher, the metal particulates are fusion bonded to each other while the liquid repellent portion is partially decomposed. Further, the metal particulates push out the liquid repellent portion by changing a shape of the metal particulates due to fusion bonding, and then penetrate through the liquid repellent portion, thereby being coupled to the conductive post forming material. As a result, the conductive post penetrating through the insulation layer and coupled to the conductive layer covered with the insulation layer can be formed. Therefore, according to the method above, the conductive post can be positioned with high accuracy due to liquid repellency of the liquid repellent portion. Further, the metal particulates are used as a material forming the conductive post, and the liquid repellent portion is made to have the thickness of 100 nm or less, resulting in secure conduction of the conductive post and the conductive layer. Further, the liquid repellent portion is not necessarily removed before the conductive post is formed, simplifying operations and improving productivity.

Further, a method for forming a conductive post according to a second aspect of the invention includes: e) forming a metal particulate layer made of metal particulates by disposing the metal particulates in a conductive layer forming region that forms a conductive layer; f) forming a liquid repellent portion having a thickness of 100 nm or less by disposing a liquid repellent material in a conductive post forming region on the metal particulate layer; g) forming an insulation layer having an opening in a region overlapping with the conductive post forming region by disposing a liquid including an insulation layer forming material on the metal particulate layer having the liquid repellent portion formed thereon and polymerizing the insulation layer forming material; h) disposing a conductive post forming material in the opening; i) heating the metal particulate layer at a fusing temperature of the metal particulates or higher so as to fusion bond the metal particulates to each other in order to form the conductive layer, and to fusion bond the metal particulates and the conductive post forming material in order to couple the conductive layer with the conductive post.

First, the metal particulate layer is formed by disposing the metal particulates. Then, the liquid repellent portion is formed in the conductive post forming region on the metal particulate layer. Next, when the insulating ink is applied so as to cover the metal particulate layer, the insulating ink is repelled by liquid repellency of the liquid repellent portion. The insulation layer having the opening in the conductive post forming region is thus easily formed. Subsequently, the conductive post forming material is disposed in the opening formed in the conductive post forming region, and the metal particulate layer is heated at the fusing temperature of the metal particulates or higher so as to fusion bond the metal particulates to each other, thereby forming the conductive post. Here, the liquid repellent portion formed in the conductive post forming region on the metal particulate layer is extremely thin such as a thickness of 100 nm or less. Therefore, when the liquid repellent portion is heated at the fusing temperature of the metal particulates or higher, the metal particulates are fusion bonded to each other while the liquid repellent portion is partially decomposed. Further, the metal particulates push out the liquid repellent portion by changing a shape of the metal particulates due to fusion bonding, and then penetrate through the liquid repellent portion, thereby being coupled to the conductive post. As a result, the conductive post penetrating through the insulation layer and coupled to the conductive layer covered with the insulation layer can be formed. Therefore, according to the method above, the conductive post can be positioned with high accuracy due to liquid repellency of the liquid repellent portion. Further, the metal particulates are used as a material forming the conductive layer, and the liquid repellent portion is made to have the thickness of 100 nm or less, resulting in secure conduction of the conductive post and the conductive layer. Further, the liquid repellent portion is not necessarily removed before the conductive post is formed, simplifying operations and improving productivity.

In the method according to the second aspect of the invention, the conductive post forming material may include same metal particulates as the metal particulates constituting the metal particulate layer, and the metal particulate layer and the conductive post forming material may be heated at the fusing temperature of the metal particulates or higher so as to fusion bond the metal particulates serving as the conductive post forming material to each other in order to form the conductive post, and to fusion bond the metal particulates included in the metal particulate layer and the conductive post forming material in order to couple the conductive layer with the conductive post.

This can allow both the metal particulates constituting the metal particulate layer and the metal particulates disposed in the opening to fuse and fusion bond respectively. Therefore, both parts of the metal particulates grow by fusion bonding so as to penetrate through the liquid repellent portion. Thus conduction is more assuredly obtained, and the conductive post is more easily formed.

In the method according to the second aspect of the invention, step e) preferably includes: j) forming a second liquid repellent portion by disposing a liquid repellent material around the conductive layer forming region; and k) disposing a liquid including the metal particulates in a region surrounded by the second liquid repellent portion.

In the method, the liquid including the metal particulates unexpectedly disposed outside of the conductive layer forming region is repelled by the second liquid repellent region. Therefore, the metal particulates can be disposed in the conductive layer forming region as it is predetermined with high accuracy. The conductive post can be thus coupled to the conductive layer formed with high accuracy.

In the method according to the second aspect of the invention, step e) may include disposing a liquid including the metal particulates and heating the metal particulates serving as a material forming the metal particulate layer at the fusing temperature of the metal particulates or higher so as to partially fusion bond the metal particulates to each other.

When the metal particulates are partially fusion bonded to each other, the metal particulates are connected to each other and settled in a disposed position. Therefore, the metal particulates having been disposed are hard to be misaligned, facilitating a later process and more assuredly forming the conductive post.

In the methods above, the liquid repellent portion or the second liquid repellent portion is preferably formed by applying a liquid including the liquid repellent material with a droplet discharge method.

This can precisely control an amount and a position of the liquid repellent material, thereby forming a desired shape. Therefore, by controlling a shape of the liquid repellent portion, a position and size of the conductive post is precisely controllable. Further, a shape of the second liquid repellent portion is controlled, thereby forming the conductive layer in a minute shape.

In the methods above, the liquid repellent material preferably includes at least one of a silane compound and a compound including a fluoroalkyl group.

In the methods, liquid repellency required as the liquid repellent material is sufficiently maintained, thereby forming the liquid repellent portion and the second liquid repellent portion in excellent conditions.

In the methods above, the liquid repellent material preferably forms a self-assembled film on a surface where the liquid repellent material is disposed.

Further, in the methods, upon an application of the liquid repellent material, the liquid repellent material immediately forms a monomolecular film on an applied surface due to self assembling, thereby providing excellent liquid repellency. This makes it easy to form the liquid repellent portion and the second liquid repellent portion. Further, since a film thickness of the monomolecular film is defined depending on a molecule structure of the liquid repellent material to be used, the thickness of the liquid repellent portion can be easily controlled by selecting the liquid repellent material, thereby ensuring that the thickness of the liquid repellent portion is made to be 100 nm or less.

In the methods above, the liquid repellent material may be a precursor of polymer constituting the liquid repellent portion or the second liquid repellent portion, and step a) or step j) preferably includes polymerizing the liquid repellent material by heating.

In the methods, the precursor is polymerized by heating so as to assuredly provide liquid repellency.

In the methods above, the insulation layer forming material is preferably photo-curing resin.

Since such photo-curing resin has generally less shrinkage due to curing, the conductive post can be easily formed in a desired shape. Further, the resin is cured by light irradiation for a short time. Therefore, the insulation layer forming material having been disposed is prevented from flowing and deforming during curing, enabling accurate control of the shape and/or size of the conductive post. Further, the resin is cured by the light irradiation for a short time so as to form the conductive post, resulting in high operation efficiency and improving productivity compared to a case of using thermosetting resin.

Further, a method for forming a multilayered wiring substrate according to a third aspect of the invention includes: layering a first conductive layer and a second conductive layer through an insulation layer; and electrically coupling the first conductive layer with the second conductive layer through a conductive post formed by the method for forming a conductive post according to the methods described above.

The method enables manufacturing the multilayered wiring substrate that is reduced in size and highly integrated while setting a size of the conductive post with excellent controllability. Further, employing the method for forming a conductive post described above can simplify steps to form the conductive post, improving production efficiency.

Furthermore, a method for manufacturing an electronic apparatus according to a fourth aspect of the invention employs the method for forming a multilayered wiring substrate described above.

The method enables manufacturing a high-quality electronic apparatus by employing such a high-quality multilayered wiring substrate.

BRIEF DESCRIPTION OF THE DRAWINGS

The invention will be described with reference to the accompanying drawings, wherein like numbers reference like elements.

FIGS. 8A through 8F are process diagrams showing a method for forming a conductive post according to a second embodiment.

FIG. 12 is a table showing results according to a working example of the invention.

DESCRIPTION OF EXEMPLARY EMBODIMENTS

First Embodiment

A method for manufacturing a conductive post according to a first embodiment of the invention will now be described with reference to FIGS. 1 through 6D. In all accompanying drawings, the film thickness and the scale of each element is adequately changed, so that they are visible.

(Droplet Discharge Device)

Figure 1:
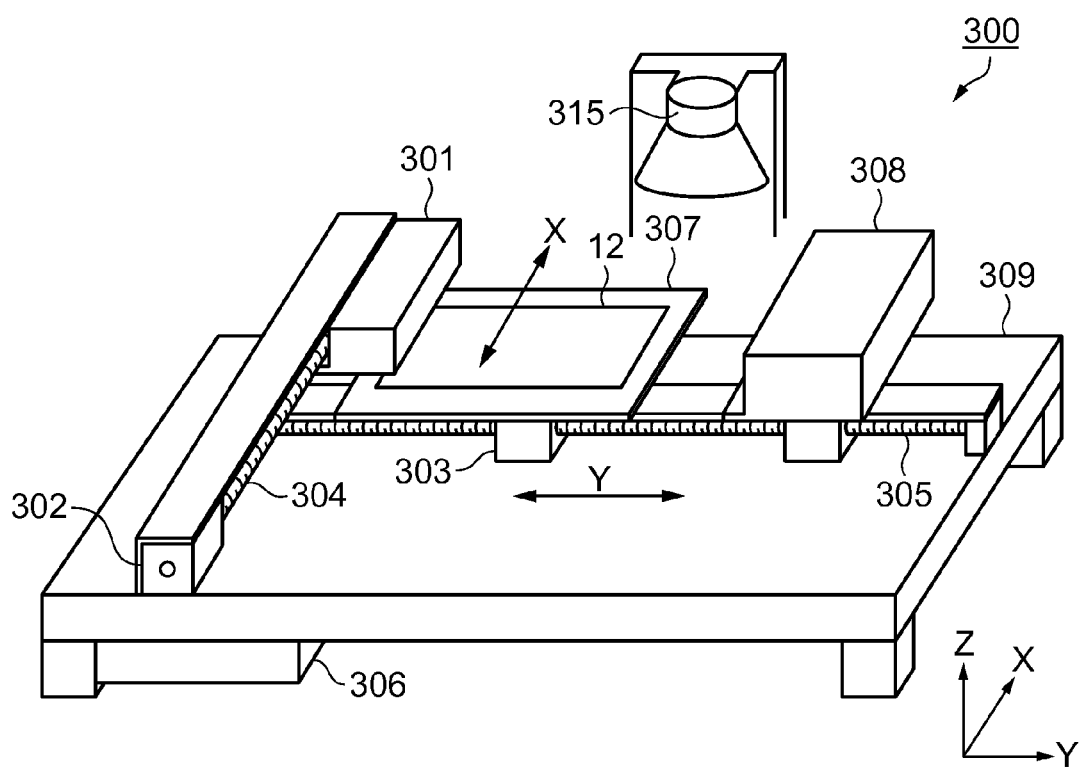
FIG. 1 is a schematic diagram showing a structure of a droplet discharge device.

First, a droplet discharge device to be used for a method for forming a conductive post according to the first embodiment will be described with reference to FIGS. 1 and 2. In the embodiment, the droplet discharge device is used for forming a solder resist. FIG. 1 is a schematic view showing a structure of the droplet discharge device. In a description about the device, a positional relation of elements will be described with reference to an XYZ rectangular coordinate system. Here, a predetermined direction on a level surface is indicated as an X-axis direction, and a direction orthogonal to the X-axis direction on the level surface is indicated as a Y-axis direction, while a vertical direction with respect to the level surface is indicated as a Z-axis direction. In the embodiment, a non-scanning direction of a droplet discharge head to be described later is the X-axis direction, and a scanning direction of the droplet discharge head is the Y-axis direction.

A droplet discharge device 300 discharging a droplet L to a substrate 12 from a droplet discharge head 301 is provided with the droplet discharge head 301, an X-direction drive axis 304, a Y-direction guide axis 305, a controller 306, a stage 307, a cleaning mechanism 308, a base 309, and a heater 315.

The droplet discharge head 301 is a multi-nozzle type droplet discharge head including a plurality of discharge nozzles. The longitudinal direction of the droplet discharge head 301 coincides with the X-axis direction. The plurality of discharge nozzles are disposed at a fixed interval in the X-axis direction on a lower surface of the droplet discharge head 301. The discharge nozzles included in the droplet discharge head 301 discharge a droplet L of a liquid to the substrate 12 supported by the stage 307. In the embodiment, the liquid will be a liquid including a liquid repellent material (a first liquid L1), a liquid including an insulating material (a second liquid L2), or a liquid including metal particulates (a third liquid L3).

The X-direction drive axis 304 is securely fixed to the base 309 so as not to move, and coupled with an X-direction drive motor 302. The X-direction drive motor 302 is a stepping motor or the like, and rotates the X-direction drive axis 304 when receiving a driving signal for the X-direction from the controller 306. By the rotation of the X-direction drive axis 304, the droplet discharge head 301 moves in the X-axis direction.

The Y-direction drive axis 305 is securely fixed to the base 309 so as not to move, and coupled with the stage 307 through a Y-direction drive motor 303. The Y-direction drive motor 303 is a stepping motor or the like, and moves the stage 307 in the Y-direction along the Y-direction guide axis 305 when receiving a driving signal for the Y-direction from the controller 306.

The controller 306 supplies a voltage to the droplet discharge head 301 for controlling discharging the droplet L. The controller 306 also supplies the X-direction drive motor 302 with a drive pulse signal for controlling the movement of the droplet discharge head 301 in the X-direction, and supplies the Y-direction drive motor 303 with a drive pulse signal for controlling the movement of the stage 307 in the Y-direction. Further, the controller 306 also controls turning on and off of the heater 315 described later.

The stage 307 supports the substrate 12 described later to dispose the liquid by the droplet discharge device 300, and includes a fixing mechanism (not illustrated) for fixing the substrate 12 to a reference position. Further, the state 307 is provided with the Y-direction drive motor 303 described above on the other surface of the surface to which the substrate 12 is fixed.

The cleaning mechanism 308 cleans the droplet discharge head 301. The cleaning mechanism 308 is provided with a Y-direction drive motor which is not shown. By driving the Y-direction drive motor, the cleaning mechanism 308 is moved along the Y-direction guide axis 305. The movement of the cleaning mechanism 308 is also controlled by the controller 306.

The heater 315 performs heat treatment on the substrate 12 by lamp annealing so as to evaporate and dry a solvent contained in the droplet L that has been applied on the substrate 12.

The droplet discharge device 300 discharges the droplet L to the substrate 12 while relatively scanning the droplet discharge head 301 and the stage 307 supporting the substrate 12. In the embodiment, the discharge nozzles of the droplet discharge head 301 are disposed to be aligned in the X-direction that is the non-scanning direction at a regular interval. While the droplet discharge head 301 is disposed at right angle to the moving direction of the substrate 12 in FIG. 1, the angle of the droplet discharge head 301 may be adjusted so as to intersect with the moving direction of the substrate 12. Thus, a pitch between the nozzles can be adjustable by adjusting the angle of the droplet discharge head 301. In addition, the distance between the substrate 12 and a nozzle surface may be made to be arbitrarily adjustable.

Figure 2:
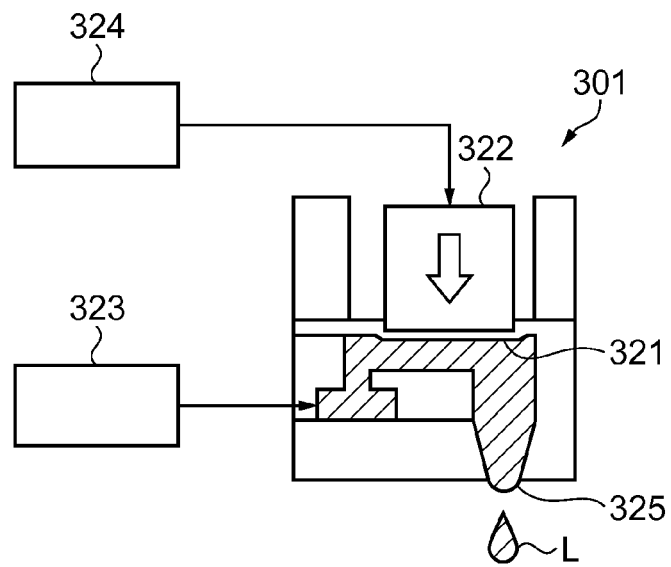
FIG. 2 is a sectional view of a droplet discharge head included in the droplet discharge device.

FIG. 2 is a sectional view of the droplet discharge head 301.

In the droplet discharge head 301, a piezo element 322 is disposed adjacent to a liquid chamber 321 that stores the liquid. The liquid is supplied to the liquid chamber 321 through a liquid supply system 323 including a material tank that stores the liquid.

The piezo element 322 is coupled to a driving circuit 324. A voltage is applied to the piezo element 322 through the driving circuit 324 so as to deform the piezo element 322, and accordingly the liquid chamber 321 is deformed and made to have a high inside pressure, thereby discharging the droplet L of the liquid from a nozzle 325. In this case, a strain amount of the piezo element 322 can be controlled by changing the value of the applied voltage so as to control a discharge amount of the liquid. In addition, strain velocity of the piezo element 322 is controlled by changing a frequency of the applied voltage. The droplet discharge by the piezo method has an advantage in that a composition of a material is unlikely affected since heat application to the material is not performed.

Examples of a discharging technique of a droplet discharge method include: charge control, pressurized vibration, electrothermal conversion, and electrostatic attraction as well as the above-mentioned electromechanical conversion. The charge control is a method that applies an electric charge to a material by a charge electrode so as to control a flying direction of the material with a deflecting electrode, discharging the material from a discharge nozzle. The pressurized vibration is a method that, for example, applies ultra-high pressure of approximately 30 kg/cm$^2$ to a material so as to discharge the material at the tip of a nozzle. If a control voltage is not applied, the material moves straight ahead so as to be discharged from a discharge nozzle. If a control voltage is applied, electrostatic repelling occurs in the material so as to disperse the material, whereby the material is not discharged from the nozzle.

The electrothermal conversion is a method in which a material is rapidly evaporated with a heater provided in a space storing a material so as to produce bubbles, and the material is discharged out of the space due to pressure of the bubbles. The electrostatic attraction is a method in which micro pressure is applied to a space storing a material so as to form a meniscus of the material at a discharge nozzle and then electrostatic attraction is applied in this state so as to pull out the material. Other than these methods, a method using a fluid viscosity change caused by an electric field, and a method using electric discharge sparks can also be employed. The droplet discharge method has an advantage of adequately disposing a material in a desired amount to a desired position with little waste of the material. An amount of one droplet of the liquid material (fluid) discharged by the droplet discharge method is, for example, from 1 to 300 nanograms. The surface tension of the droplet discharged from the droplet discharge device 300 described above is preferably within a range from 0.02 N/m to 0.07 N/m inclusive. If the surface tension is below 0.02 N/m when the liquid is discharged by using the droplet discharge method, wettability of the droplet with respect to a surface of the discharge nozzle is increased, rendering it likely to cause a flight curve, while if the surface tension exceeds 0.07 N/m, a meniscus shape at a tip of the nozzle is unstable, rendering the control of the discharge amount and discharge timing problematic. To adjust the surface tension, a fluorine-, silicone- or nonionic-based surface tension regulator, for example, may be added in a small amount to the dispersion liquid within a range not largely lowering a contact angle to the substrate 12. The nonionic surface tension regulator enhances the wettability of the droplet with respect to the substrate 12, improves leveling property of a film, and serves to prevent minute ridges and valleys of film from being made. The surface tension regulator may include, as necessary, an organic compound such as alcohol, ether, ester, and ketone.

The viscosity of the droplet is preferably within the range from 1 mPa·s to 50 mPa·s inclusive. In discharging droplets by the droplet discharge method, when the viscosity is lower than 1 mPa·s, the periphery of the nozzle 325 is likely contaminated due to leakage of the droplets. On the other hand, when the viscosity is higher than 50 mPa·s, a frequency of nozzle clogging at the nozzle 325 is increased, making it difficult to discharge droplets smoothly.

(Droplet Discharge Method)

Figure 3:
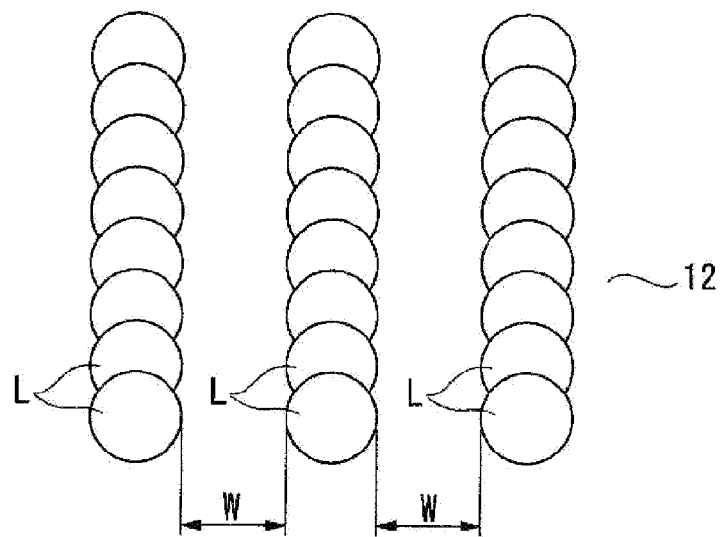
FIG. 3 is a schematic diagram showing a method for forming a pattern by a droplet discharge method.
Figure 4:
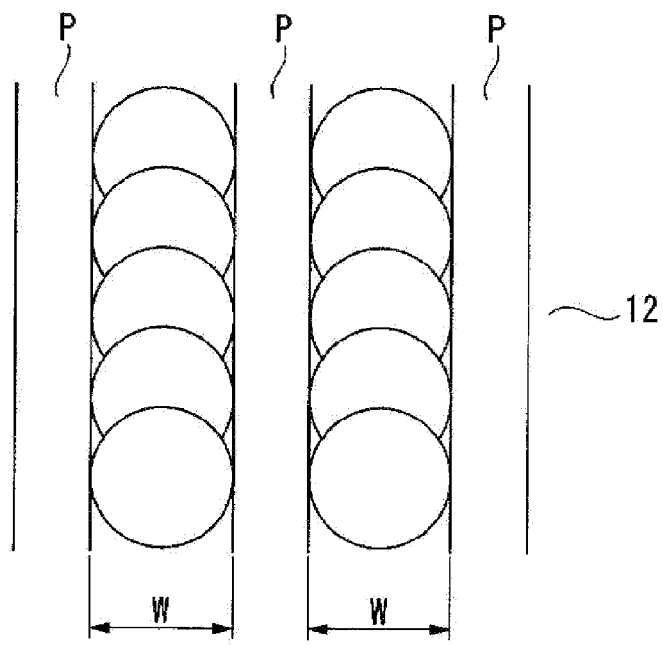
FIG. 4 is a schematic diagram showing a method for forming a pattern by a droplet discharge method.

FIGS. 3 and 4 are schematic diagrams showing a method for applying the liquid by the droplet discharge method. As shown in FIG. 3, the droplets L sequentially discharged from the droplet discharge head 301 land on a surface of the substrate 12. At this time, the droplets L are discharged and applied in a position so that adjacent droplets overlap with one another. This can continuously form an application pattern drawn with the droplets L having been applied by one scan of the droplet discharge head 301 to the substrate 12. Further, a desired application pattern is controllable by a discharge amount of the droplets L to be discharged and a pitch of the droplets L that are adjacent to each other. FIG. 3 shows an application pattern that forms a linear shape. However, a space between the application patterns to be adjacent to each other (width W in FIG. 3) can not be formed so that the droplets L are applied to form a planar shape.

When the droplets L to be applied include a liquid repellent material, as shown in FIG. 4, a liquid repellent pattern P including the application pattern of the droplets L is formed.

If the third liquid L3 including metal particulates is applied to a space between the liquid repellent patterns P, for example, the metal particulates are disposed according to a pattern formed by the space between the liquid repellent pattern P. The third liquid L 3 that is applied to overlap with the liquid repellent patterns P is repelled due to liquid repellency of the liquid repellent pattern P, thereby efficiently wetting and spreading to the space between the liquid repellent patterns P. The third liquid L3 can be subjected to predetermined treatment so as to form wiring having the width W.

(Liquid Repellent Material/First Liquid)

Next, each liquid to be applied by the droplet discharge device 300 in the first embodiment will be sequentially described. First, the liquid including a liquid repellent material (the first liquid L1) for forming a liquid repellent portion will be described. As the liquid repellent material, a silane compound, a compound including a fluoroalkyl group, and a fluorine contained resin (resin containing fluorine), or these commixture can be used in the first embodiment. As the silane compound, one or two or more silane compounds expressed by a general formula (1) can be used.

$$R^1SiX^1X^2X^3 \quad (1)$$

(In the formula, $R^1$ indicates an organic group, $X^1$ indicates —$OR^2$ and —Cl, $X^2$ and $X^3$ indicate —$OR^2$, —$R^3$, and —Cl, $R^2$ indicates an alkyl group having from 1 to 4 carbons, $R^3$ indicates a hydrogen atom or an alkyl group having from 1 to 4 carbons. $X^1$, $X^2$, and $X^3$ can be either identical or different from each other.)

In the silane compound expressed by the general formula (1), a silane atom is substituted by an organic group, and other bonds are substituted by an alkoxy group, an alkyl group, or a chlorine group. Examples of the organic group $R^1$ include: a phenyl group, a benzyl group, a phenethyl group, a hydroxyphenyl group, a chlorophenyl group, an aminophenyl group, a naphthyl group, an anthrenyl group, a pyrenyl group, a thienyl group, a pyrrolyl group, a cyclohexyl group, a cyclohexenyl group, a cyclopentyl group, a cyclopentenyl group, a pyridinyl group, a methyl group, an ethyl group, an n-propyl group, an isopropyl group, an n-butyl group, an isobutyl group, a sec-butyl group, a tert-butyl group, an octadecyl group, an n-octyl group, a chloromethyl group, a methoxyethyl group, a hydroxyethyl group, an aminoethyl group, a cyano group, a mercaptopropyl group, a vinyl group, an allyl group, an acryloxyethyl group, a methacryloxyethyl group, a glycidoxypropyl group, and an acetoxy group.

The alkoxy group and the chlorine group that are indicated as —$OR^2$ are functional groups to form a Si—O—Si bond, and are hydrolyzed with water to be removed as alcohol or acid. Examples of the alkoxy group includes: a methoxy group, an ethoxy group, an n-propoxy group, an isopropoxy group, an n-butoxy group, an isobutoxy group, a sec-butoxy group, and a tert-butoxy group. The number of carbons of such an alkoxy group is preferably within a range from 1 to 4 from the point of view that alcohol to be removed has a relatively small molecular amount so as to be easily removed and therefore density of a film to be formed can be prevented from being lowered.

Examples of the silane compound expressed in the general formula (1) include: dimethyldimethoxysilane, diethyldiethoxysilane, 1-propenylmethyldichlorosilane, propyldimethylchlorosilane, propylmethyldichlorosilane, propyltrichlorosilane, propyltriethoxysilane, propyltrimethoxysilane, styrylethyltrimethoxysilane, tetradecyltrichlorosilane, 3-thiocyanatepropyltriethoxysilane, p-tolyldimethylchlorosilane, p-tolylmethyldichlorosilane, p-tolyltrichlorosilane, p-tolyltrimethoxysilane, p-tolyltriethoxysilane, di-n-propyldi-n-propoxysilan, diisopropyldiisopropoxysilane, di-n-butyldi-n-butyloxysilane, di-sec-butyldi-sec-butyloxysilane, di-t-butyldi-t-butyloxysilane, octadecyltrichlorosilane, octadecylmethyldiethoxysilane, octadecyltriethoxysilane, octadecyltrimethoxysilane, octadecyldimethylchlorosilane, octadecylmethyldichlorosilane, octadecylmethoxydichlorosilane, 7-octenyldimethylchlorosilane, 7-octenyltrichlorosilane, 7-octenyltrimethoxysilane, octylmethyldichlorosilane, octyldimethylchlorosilane, octyltrichlorosilane, 10-undecenyldimethylchlorosilane, undecyltrichlorosilane, vinyldimethylchlorosilane, methyloctadecyldimethoxysilane, methyldodecyldiethoxysilane, methyloctadecyldimethoxysilane, methyloctadecyldiethoxysilane, n-octylmethyldimethoxysilane, n-octylmethyldiethoxysilane, triacontyldimethylchlorosilane, triacontyltrichlorosilane, methyltrimethoxysilane, methyltriethoxysilane, methyltri-n-propoxysilane, methylisopropoxysilane, methyl-n-butyloxysilane, methyltri-sec-butyloxysilane, methyltri-t-butyloxysilane, ethyltrimethoxysilane, ethyltriethoxysilane, ethyltri-n-propoxysilane, ethylisopropoxysilane, ethyl-n-butyloxysilane, ethyltri-sec-butyloxysilane, ethyltri-t-butyloxysilane, n-propyltrimethoxysilane, isobutyltrimethoxysilane, n-hexyltrimethoxysilane, hexadecyltrimethoxysilane, n-octyltrimethoxysilane, n-dodecyltrimethoxysilane, n-octadecyltrimethoxysilane, n-propyltriethoxysilane, isobutyltriethoxysilane, n-hexyltriethoxysilane, hexadecyltriethoxysilane, n-octyltriethoxysilane, n-dodecyltriethoxysilane, n-octadecyltriethoxysilane, 2-[2-(trichlorosilyl)ethyl]pyridine, 4-[2-(trichlorosilyl)ethyl]pyridine, diphenyldimethoxysilane, diphenyldiethoxysilane, 1,3-(trichlorosilylmethyl) heptacosane, dibenzyldimethoxysilane, dibenzyldiethoxysilane, phenyltrimethoxysilane, phenylmethyldimethoxysilane, phenyldimethylmethoxysilane, phenyldimethoxysilane, phenyldiethoxysilane, phenylmethyldiethoxysilane, phenyldimethylethoxysilane, benzyltriethoxysilane, benzyltrimethoxysilane, benzylmethyldimethoxysilane, benzyldimethylmethoxysilane, benzyldimethoxysilane, benzyldiethoxysilane, benzylmethyldiethoxysilane, benzyldimethylethoxysilane, benzyltriethoxysilane, dibenzyldimethoxysilane, dibenzyldiethoxysilane, 3-acetoxypropyltrimethoxysilane, 3-acryloxypropyltrimethoxysilane, allyltrimethoxysilane, allyltriethoxysilane, 4-aminobutyltriethoxysilane, (aminoethylaminomethyl)phenethyltrimethoxysilane, N-(2-aminoethyl)-3-aminopropylmethyldimethoxysilane, N-(2-aminoethyl)-3-aminopropyltrimethoxysilane, 6-(aminohexylaminopropyl)trimethoxysilane, p-aminophenyltrimethoxysilane, p-aminophenylethoxysilane, m-aminophenyltrimethoxysilane, m-aminophenylethoxysilane, 3-aminopropyltrimethoxysilane, 3-aminopropyltriethoxysilane, ω-aminoundecyltrimethoxysilane, amyltriethoxysilane, 5-(bicycloheptenyl)triethoxysilane, bis(2-hydroxyethyl)-3-aminopropyltriethoxysilane, 8-bromooctyltrimethoxysilane, bromophenyltrimethoxysilane, 3-bromopropyltrimethoxysilane, n-butyltrimethoxysilane, 2-chloromethyltriethoxysilane, chloromethylmethyldiethoxysilane, chloromethylmethyldiisopropoxysilane, p-(chloromethyl)phenyltrimethoxysilane, chloromethyltriethoxysilane, chlorophenyltriethoxysilane, 3-chloropropylmethyldimethoxysilane, 3-chloropropyltriethoxysilane, 3-chloropropyltrimethoxysilane, 2-(4-chlorosulfonylphenyl) ethyltrimethoxysilane, 2-cyanoethyltriethoxysilane, 2-cyanoethyltrimethoxysilane, cyanomethylphenethyltriethoxysilane, 3-cyanopropyltriethoxysilane, 2-(3-cyclohexenyl)ethyltrimethoxysilane, 2-(3-cyclohexenyl) ethyltriethoxysilane, 3-cyclohexenyltrichlorosilane, 2-(3- cyclohexenyl)ethyltrichlorosilane, 2-(3-cyclohexenyl)ethyldimethylchlorosilane, 2-(3-cyclohexenyl)ethylmethyldichlorosilane, cyclohexyldimethylchlorosilane, cyclohexylethyldimethoxysilane, cyclohexylmethyldichlorosilane, cyclohexylmethyldimethoxysilane, (cyclohexylmethyl)trichlorosilane, cyclohexyltrichlorosilane, cyclohexyltrimethoxysilane, cyclooctyltrichlorosilane, (4-cyclooctenyl)trichlorosilane, cyclopentyltrichlorosilane, cyclopentyltrimethoxysilane, 1,1-diethoxy-1-silacyclopenta-3-ene.

Examples of the silane compound other than the above include: 3-(2,4-dinitrophenylamino)propyltriethoxysilane, (dimethylchlorosilyl)methyl-7,7-dimethylnorpinane, (cyclohexylaminomethyl)methyldiethoxysilane, (3-cyclopentadienylpropyl)triethoxysilane, (N,N-diethyl-3-aminopropyl)trimethoxysilane, 2-(3,4-epoxycyclohexyl)ethyltrimethoxysilane, 2-(3,4-epoxycyclohexyl)ethyltriethoxysilane, (furfuryloxymethyl)triethoxysilane, 2-hydroxy-4-(3-triethoxypropoxy)diphenylketone, 3-(p-methoxyphenyl)propylmethyldichlorosilane, 3-(p-methoxyphenyl)propyltrichlorosilane, p-(methylphenethyl)methyldichlorosilane, p-(methylphenethyl)trichlorosilane, p-(methylphenethyl)dimethylchlorosilane, 3-morpholinopropyltrimethoxysilane, (3-glycidoxypropyl)methyldiethoxysilane, 3-glycidoxypropyltrimethoxylsilane, 1,2,3,4,7,7,-hexachloro-6-methyldiethoxysilyl-2-norbornene, 1,2,3,4,7,7,-hexachloro-6-triethoxysilyl-2-norbornene, 3-iodpropyltrimethoxysilane, 3-isocyanatepropyltriethoxysilane, (mercaptomethyl)methyldiethoxysilane, 3-mercaptopropylmethyldimethoxysilane, 3-mercaptopropyldimethoxysilane, 3-mercaptopropyltriethoxysilane, 3-methacryloxypropylmethyldiethoxysilane, 3-methacryloxypropyltrimethoxysilane, methyl[2-(3-trimethoxysilylpropylamino)ethylamino]-3-propionate, 7-octenyltrimethoxysilane, R—N-α-phenethyl-N'-triethoxysilylpropylurea, S—N-α-phenethyl-N'-triethoxysilylpropylurea, phenethyltrimethoxysilane, phenethylmethyldimethoxysilane, phenethyldimethylmethoxysilane, phenethyldimethoxysilane, phenethyldiethoxysilane, phenethylmethyldiethoxysilane, phenethyldimethylethoxysilane, phenethyltriethoxysilane, (3-phenylpropyl)dimethylchlorosilane, (3-phenylpropyl)methyldichlorosilane, N-phenylaminopropyltrimethoxysilane, N-(triethoxysilylpropyl)dansylamide, N-(3-triethoxysilylpropyl)-4,5-dihydroimidazole, 2-(triethoxysilylethyl)-5-(chloroacetoxy)bicycloheptane, (S)—N-triethoxysilylpropyl-O-menthocarbamate, 3-(triethoxysilylpropyl)-p-nitrobenzamide, 3-(triethoxysilyl)propylsuccinicanhydride, N-[5-(trimethoxysilyl)-2-aza-1-oxo-pentyl]caprolactam, 2-(trimethoxysilylethyl)pyridine, N-(trimethoxysilylethyl)benzyl-N,N,N-trimethylammonium chloride, phenylvinyldiethoxysilane, 3-thiocyanatepropyltriethoxysilane, (tridecafluoro-1,1,2,2,-tetrahydrooctyl)triethoxysilane, N-[3-(triethoxysilyl)propyl]phthalamic acid, (3,3,3-trifluoropropyl)methyldimethoxysilane, (3,3,3-trifluoropropyl)trimethoxysilane, 1-trimethoxysilyl-2-(chloromethyl)phenylethane, 2-(trimethoxysilyl)ethylphenylsulfonylazide, β-trimethoxysilylethyl-2-pyridine, trimethoxysilylpropyldiethylenetriamine, N-(3-trimethoxysilylpropyl)pyrrole, N-trimethoxysilylpropyl-N,N, N-tributylammonium bromide, N-trimethoxysilylpropyl-N,N,N-tributylammonium chloride, N-trimethoxysilylpropyl-N,N, N-trimethylammonium chloride, vinylmethyldiethoxysilane, vinyltriethoxysilane, vinylmethyldimethoxysilane, vinyldimethylmethoxysilane, vinyldimethylethoxysilane, vinylmethyldichlorosilane, vinylphenyldichlorosilane, vinylphenyldiethoxysilane, vinylphenyldimethylsilane, vinylphenylmethylchlorosilane, vinyltris-t-butoxysilane, adamantylethyltrichlorosilane, allylphenyltrichlorosilane, (aminoethylaminomethyl)phenethyltrimethoxysilane, 3-aminophenoxydimethylvinylsilane, phenyltrichlorosilane, phenyldimethylchlorosilane, phenylmethyldichlorosilane, benzyltrichlorosilane, benzyldimethylchlorosilane, benzylmethyldichlorosilane, phenethyldiisopropylchlorosilane, phenethyltrichlorosilane, phenethyldimethylchlorosilane, phenethylmethyldichlorosilane, 5-(bicycloheptenyl)trichlorosilane, 5-(bicycloheptenyl)triethoxysilane, 2-(bicycloheptyl)dimethylchlorosilane, 2-(bicycloheptyl)trichlorosilane, 1,4-bis(trimethoxysilylethyl)benzene, bromophenyltrichlorosilane, 3-phenoxypropyldimethylchlorosilane, 3-phenoxypropyltrichlorosilane, t-butylphenylchlorosilane, t-butylphenylmethoxysilane, t-butylphenyldichlorosilane, p-(t-butyl)phenethyldimethylchlorosilane, p-(t-butyl)phenethyltrichlorosilane, 1,3-(chlorodimethylsilylmethyl)heptacosane, ((chloromethyl)phenylethyl)dimethylchlorosilane, ((chloromethyl)phenylethyl)methyldichlorosilane, ((chloromethyl)phenylethyl)trichlorosilane, ((chloromethyl)phenylethyl)trimethoxysilane, chlorophenyltrichlorosilane, 2-cyanoethyltrichlorosilane, 2-cyanoethylmethyldichlorosilane, 3-cyanopropylmethyldiethoxysilane, 3-cyanopropylmethyldichlorosilane, 3-cyanopropyldimethylethoxysilane, 3-cyanopropylmethyldichlorosilane, and 3-cyanopropyltrichlorosilane.

By using such a silane compound as the liquid repellent material, a self-assembled film of the silane compound is formed on a disposed position, providing a superior liquid repellency to a surface of the film.

Among the silane compounds, an alkylsilane compound containing fluorine, which is an alkyl group directly bonding to Si, including a perfluoroalkyl structure indicated as $C_nF_{2n+1}$ is preferably used. This can be exemplified by a compound expressed by a general formula (2) below.

$$C_nF_{2n+1}(CH_2)_mSiX^1X^2X^3 \qquad (2)$$

(In Formula (2), n indicates an integer number from 1 to 18, m indicates an integer number from 2 to 6, $X^1$ indicates —$OR^2$ and —Cl, $X^2$ and $X^3$ indicate —$OR^2$, —$R^3$, and —Cl, $R^2$ indicates an alkyl group having from 1 to 4 carbons, $R^3$ indicates a hydrogen atom or an alkyl group having from 1 to 4 carbons. $X^1$, $X^2$, and $X^3$ can be either identical or different from each other.)

The alkoxy group and the chlorine group that are indicated as —$OR^2$ are functional groups to form a Si—O—Si bond, and are hydrolyzed with water to be removed as alcohol or acid. Examples of the alkoxy group includes: a methoxy group, an ethoxy group, an n-propoxy group, an isopropoxy group, an n-butoxy group, an isobutoxy group, a sec-butoxy group, and a tert-butoxy group. The number of carbons in the alkoxy group is preferably within a range from 1 to 4 from the point of view that alcohol to be removed is easily removable because a molecular amount of the alcohol is relatively small and therefore density of a film to be formed can be prevented from decreasing.

By using the alkylsilane compound containing fluorine as described above, each compound is oriented so that the fluoroalkyl group is disposed on the surface of a film to form a self-assembled film. Thus, an excellent liquid repellency can be provided to the surface of the film.

Specifically, examples of the compound can include: $CF_3$—$CH_2CH_2$—$Si(OCH_3)_3$, $CF_3(CF_2)_3$—$CH_2CH_2$—$Si(OCH_3)_3$, $CF_3(CF_2)_5$—$CH_2CH_2$—$Si(OCH_3)_3$, $CF_3(CF_2)_5$—$CH_2CH_2$—$Si(OC_2H_5)_3$, $CF_3(CF_2)_7$—$CH_2CH_2$—$Si(OCH_3)_3$, $CF_3(CF_2)_{11}$—$CH_2CH_2$—$Si(OC_2H_5)_3$, $CF_3$ $(CF_2)_3$—$CH_2CH_2$—$Si(CH_3)(OCH_3)_2$, $CF_3(CF_2)_7$—$CH_2CH_2$—$Si(CH_3)(OCH_3)_2$, $CF_3(CF_2)_8$—$CH_2CH_2$—$Si(CH_3)(OC_2H_5)_2$, and $CF_3(CF_2)_8$—$CH_2CH_2$—$Si(C_2H_5)(OC_2H_5)_2$.

In a case where fluorine resin is used as the liquid repellent material, a liquid obtained by dissolving a predetermined amount of fluorine resin in a predetermined solvent is used. Specifically, "EGC1720" (in which fluorine resin is dissolved in a hydrofluoroether (HFE) solvent at 0.1 wt %) produced by Sumitomo 3M Limited can be used. In this case, an alcohol, hydrocarbon, ketone, ether, or ester solvent is adequately mixed with HFE, so that the liquid can be adjusted to be discharged stably from the droplet discharge head 301. Alternatively, "LUMIFLON" (which can be dissolved in various solvents) produced by Asahi Glass Co., Ltd., "OPTOOL" (solvent: PFC, HFE, for example) produced by Daikin Industries. Ltd., and "DICGUARD" (solvent: toluene, water and ethylene glycol) produced by Dainippon Ink And Chemicals, Incorporated can be used as the fluorine resin. Further, as resin containing fluorine, resin including an F group, —$CF_3$, —$(CF_2)nCF_3$ in a side chain thereof, or resin including —$CF_2$—, —$CF_2nCF_3$, and —$CF_2CFCl$- in a main chain thereof can be used. Further, when heating and polymerization are necessary for obtaining liquid repellency, applied resin containing fluorine can be heated at from 150 to 200 degrees Celsius, for example, so as to obtain liquid repellency as needed. In the embodiment, octadecyltrimethoxysilane (ODS) is used for the liquid repellent material.

(Insulation Layer Forming Material/Second Liquid)

Subsequently, the liquid including an insulation layer forming material (the second liquid L2) for forming an insulation layer in the embodiment will be described. In the embodiment, the second liquid is applied to other than a conductive post forming region by the droplet discharge method described above so as to form an insulation layer having an opening in the conductive post forming region.

As the insulation layer forming material, a material having a photo curing property is used in the embodiment. Specifically, the photo curing material in the embodiment includes a photo-polymerization initiator, a monomer of acrylic acid and/or an oligomer. In general, the photo curing material can contain a solvent, and resin dissolved into the solvent. Here, the photo curing material in this case may contain resin that increases a degree of polymerization by reacting itself to light, or may contain a photo-polymerization initiator to start curing of the resin. Further, as a substitute for the above, a monomer generating insoluble insulation resin by photo polymerization and a photo-polymerization initiator to start the photo polymerization of the monomer may be included as the photo curing material. However, the photo curing material in this case does not need to include a photo-polymerization initiator if the monomer itself includes a photo functional group. Further, although the photo curing resin is used in the embodiment, thermosetting resin such as polyimide can also be used.

(Metal Particulates/Third Liquid)

Subsequently, the liquid including metal particulates (the third liquid L3) for forming a conductive post according to the embodiment will be described. In the embodiment, the third liquid is applied to a predetermined region by the droplet discharge method described above so as to form the conductive post. Examples of the metal particulates contained in the third liquid include any of gold, silver, copper, palladium, nickel, and ITO, and oxides of these materials. The third liquid is a dispersion-liquid having the metal particulates dispersed therein. The metal particulates may be used by coating organic matter on their surfaces in order to improve dispersion property.

The diameter of the metal particulates is preferably in the range from 1 nm to 0.1 μm inclusive. Particulates having a diameter larger than 0.1 μm may cause clogging of the nozzle 325 of the droplet discharge head 301 shown in FIG. 2. On the other hand, particulates having a diameter smaller than 1 nm may lead concerns about decreasing quality because a volume ratio of the coating material to the metal particulates becomes large and foreign substances derived from the coating material remain.

Here, any dispersion medium that is capable of dispersing the above-described metal particulates and does not cause an aggregation can be used. For example, other than water, alcohols such as methanol, ethanol, propanol, butanol, or the like; a hydro-carbon compounds such as n-heptane, n-octane, decane, dodecane, tetradecane, toluene, xylene, cymene, durene, indene, dipentene, tetrahydronaphthalene, decahydronaphthalene, cyclohexylbenzene or the like; an ether compounds such as ethylene glycol dimethyl ether, ethylene glycol diethyl ether, ethylene glycol methyl ethyl ether, diethylene glycol dimethyl ether, diethylene glycol diethyl ether, diethylene glycol methyl ethyl ether, 1,2-dimethoxyethane, bis(2-methoxyethyl)ether, p-dioxane, or the like; and a polar compounds such as propylene carbonate, gamma-butyrolactone, N-methyl-2-pyrrolidone, dimethylformamide, dimethyl sulfoxide, cyclohexanone, or the like are exemplified. Water, alcohols, hydrocarbon compounds, and ether compounds are preferably used in terms of particulate dispersibility, and dispersion-liquid stability. Water and hydro-carbon compounds are used more preferably.

(Conductive Post Forming Method)

Figure 5:
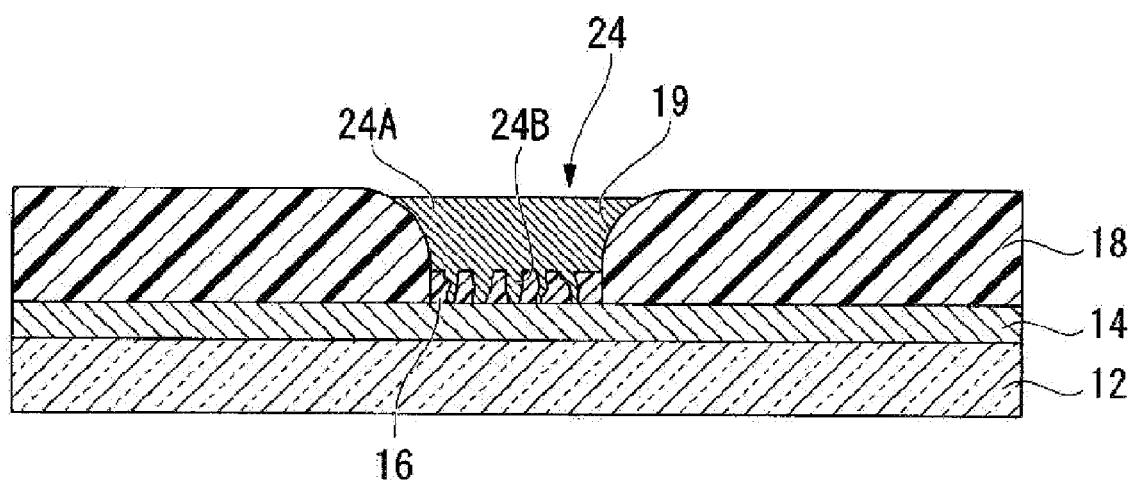
FIG. 5 is a sectional diagram showing an example of a conductive post.

Based on the above, the method for forming a conductive post according to the embodiment will now be described with reference to FIGS. 5 through 6D. FIG. 5 is a sectional view schematically showing an example structure of the conductive post formed by the method for forming a conductive post according to the embodiment.

A structure shown in FIG. 5 includes the substrate 12, a wiring (conductive layer) 14 positioned on the substrate 12, a liquid repellent portion 16 disposed in a conductive post forming region on the wiring 14, an insulation layer 18 formed in a region other than a region of the liquid repellent portion 16 formed on the wiring 14 is formed, the opening 19 formed in a region overlapping with the liquid repellent portion 16 in the insulation layer 18 in plan view, and the conductive post 24 formed at the opening 19.

Examples of a material of the substrate 12 include various types of materials such as glass, quartz glass, a Si wafer, a plastic film, and a metal plate; these material substrates provided with a semiconductor film, a metal film, a dielectric film, or an organic film formed on their surfaces as a base layer.

The wiring 14 disposed on the substrate 12 is formed by processing a metal film with a commonly known method. In the embodiment, the wiring 14 is formed by etching through a predetermined mask after patterning by photolithography. The metal film is formed on the substrate 12 with plating, sputtering, vapor deposition, a screen printing, or the like.

On the wiring 14, the liquid repellent portion 16 is formed in the region overlapping with the region to form the conductive post. The liquid repellent portion 16 is formed by disposing the liquid repellent material with a droplet discharge method. Here, although the liquid repellent portion 16 is shown, the liquid repellent portion 16 may be eliminated in a step described later. In the explanation drawings below, the liquid repellent portion 16 is shown as it remains to facilitate understanding of the invention.

On the substrate 12, the insulation layer 18 is formed in a region other than the liquid repellent portion 16. The insulation layer 18 is formed by disposing the insulation layer forming material described above with a droplet discharge method.

On the insulation layer 18, the opening 19 is formed in the region overlapping with the liquid repellent portion 16 in plan view. At the opening 19, the conductive post 24 is formed and electrically coupled to the wiring 14. The conductive post 24 includes an upper plug 24A and a lower plug 24B that are integrated. The upper plug 24A is formed at an upper part of the opening 19 so as to fill the upper part of the opening 19, while the lower plug 24B is formed at a lower part of the opening 19 so as to be coupled with the wiring 14 by penetrating through the liquid repellent portion 16.

Referring now to FIGS. 6A through 6D, the method for forming the conductive post 24 shown in FIG. 5 will be described. FIGS. 6A through 6D are process diagrams showing the method for forming the conductive post 24.

Figure 6A:
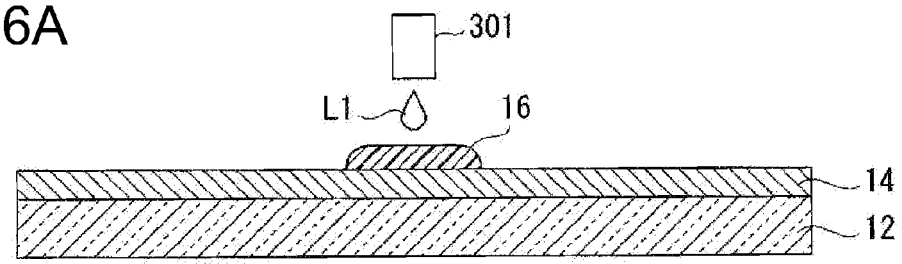
FIGS. 6A through 6D are process diagrams showing a method for forming a conductive post according to a first embodiment.

First, as shown in FIG. 6A, the first liquid L1 including a liquid repellent material is applied to the conductive post forming region of the wiring 14 formed on the substrate 12 from the droplet discharge head 301 so as to form the liquid repellent portion 16. In the embodiment, ODS that forms a self-assembled film is used as the liquid repellent material. Therefore, the liquid repellent portion 16 immediately showing liquid repellency in a region where the first liquid L1 is disposed is formed. In the drawings, the liquid repellent portion 16 is shown as if having a certain thickness. However, since the self-assembled film formed from ODS is a monomolecular film, the thickness of the liquid repellent portion is only several nm.

Figure 6B:
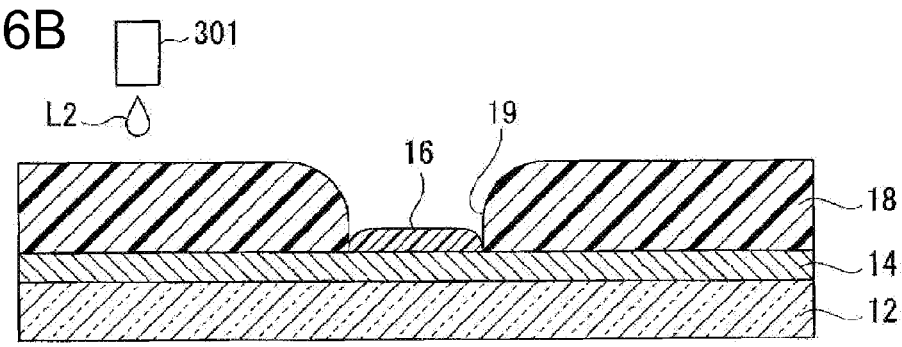

Next, as shown in FIG. 6B, the second liquid L2 including an insulation layer forming material is applied to the region where the liquid repellent portion 16 is not formed on the wiring 14 by discharging from the droplet discharge head 301. If the second liquid L2 is applied to be disposed to partially overlap with the liquid repellent portion 16, the second liquid L2 is repelled by liquid repellency of the liquid repellent portion 16, thereby flowing other regions than the conductive post forming region. The second liquid L2 that is disposed is irradiated with ultraviolet rays (not illustrated) so that the photo-curing resin included in the second liquid L2 is cured, thereby forming the insulation layer 18 having the opening 19 in the conductive post forming region.

Figure 6C:
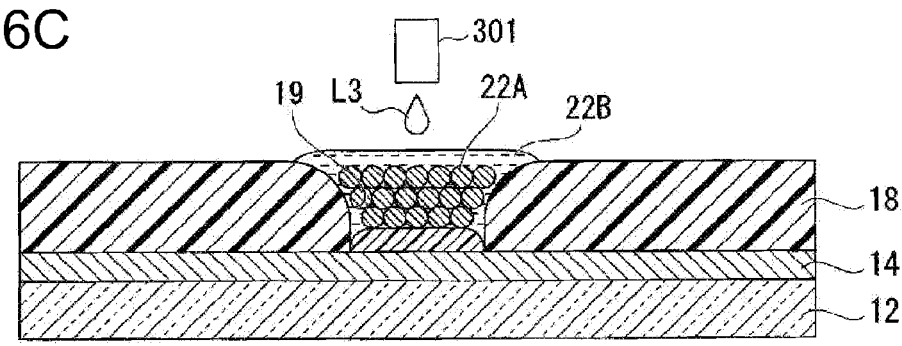

Then, as shown in FIG. 6C, the third liquid L3 is applied to the opening 19 from the droplet discharge head 301. The third liquid L3 includes metal particulates 22A and a dispersion medium 22B. Further, the metal particulates 22A are covered with a coating material that is not illustrated. By the application of the third liquid L3, the metal particulates 22A that are a material for forming the conductive post are disposed in the opening 19.

Figure 6D:
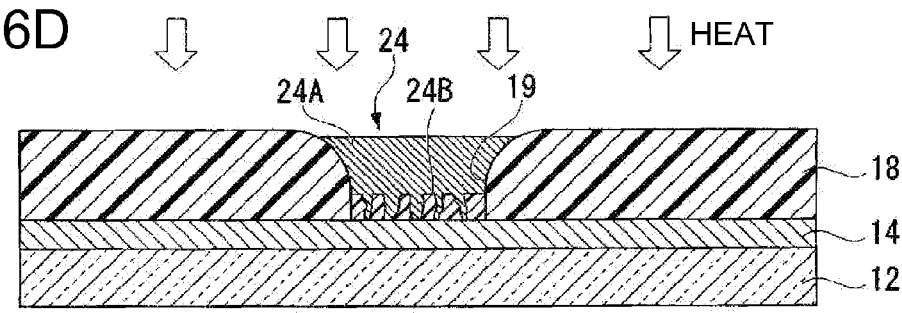

Next, as shown in FIG. 6D, a whole of the substrate 12 is heated at a temperature that is higher than or equal to a fusing temperature of the metal particulates 22A so that the metal particulates 22A contained in the third liquid L3 disposed in the opening 19 is thermally treated. In the embodiment, silver (Ag) particulates having a particulate diameter of 10 nm are used as the metal particulates 22A, and thermally treated at 180 degrees Celsius for 60 minutes.

Here, the heating temperature used in the embodiment is not "higher than or equal to a melting point of metal", but "higher than or equal to a fusing temperature of the metal particulates". Generally, a melting point of a substance tends to decrease when the substance is in a state of particulates. A melting temperature of silver that is metal used in the embodiment is 961 degrees Celsius. However, silver metal particulates to be used has an extremely small as its diameter is 10 nm. Therefore, the melting point decreases to about 120 degrees Celsius. Accordingly, when heated to be at about 120 degrees Celsius, the metal particulates start fusing and fusion bonding to each other. That is, a heating condition of the embodiment, 180 degrees Celsius, is higher than the fusing point of the metal particulates to be used.

When the heating is performed under the condition described above, the dispersion medium 22B in the third liquid L3 disposed on the substrate 12 is removed. If a surface of the metal particulates 22A is coated by a coating material such as an organic material in order to improve dispersibility, the coating material is also removed at the same timing. The heating in the embodiment is performed with an electric furnace (not illustrated) so as to form the conductive post.

The heating is performed in the normal atmosphere, but it may be performed in an inert gas atmosphere such as nitrogen, argon or helium, as necessary. Further, the heating temperature will be determined at an appropriate level, taking into account a boiling point (vapor pressure) of the dispersion medium 22B, a type and pressure of an atmospheric gas, thermal behavioral properties such as the dispersibility and oxidizability of the metal particulates 22A, existence and an amount of the coating material, and a heat resistance temperature of the base, or the like.

For example, the coating material made of an organic substance is preferably removed by heating at about 300 degrees Celsius for operational efficiency and secure removal. However, when a plastic substrate or the like is used, the heating is preferably performed in a temperature range from a room temperature to 100 degrees Celsius inclusive.

The heating may be performed by lamp annealing as well as an ordinary heating method employing a heating means such as a hotplate and an electric furnace. Light sources for lamp annealing are not limited but examples thereof can include: an infrared lamp, a xenon lamp, YAG laser, argon laser, carbon dioxide laser, and excimer laser of XeF, XeCl, XeBr, KrF, KrCl, ArF, and ArCl, or the like.

The heating advances evaporation of the dispersion medium 22B and removal of the coating material that is not illustrated, leading fusing of the metal particulates 22A and fusion bonding of the metal particulates 22A to each other according to the fusing. The metal particulates 22A disposed at the upper part of the opening 19 fusion bond to each other so as to form the upper plug 24A. Further, the metal particulates 22A disposed at the lower part of the opening 19 also fusion bond to each other. Here, the thickness of the liquid repellent potion 16 is extremely thin such as only several nm. Therefore, when the heating is performed at a temperature higher than the fusing point of the metal particulates 22, the metal particulates 22A disposed at the lower part of the opening 19 fusion bond to each other while the liquid repellent portion 16 is partially decomposed. Consequently, the metal particulates 22A penetrates through the liquid repellent portion 16 and is coupled to the wiring 14, thus forming the lower plug 24B. The upper plug 24A and the lower plug 24B are fusion bonded to each other so as to be integrated, forming the conductive post 24 as a whole. Therefore, the conductive post 24 is coupled to the wiring 14. Through the above, the conductive post 24 electrically coupled to the wiring 14 is completed.

According to the method for forming the conductive post 24 having the structure above, the conductive post 24 can be positioned with high accuracy due to liquid repellency of the liquid repellent portion 16. Moreover, the metal particulates 22A are used as the material forming the conductive post 24, and the liquid repellent portion 16 is made to have a thickness of 100 nm or less, so that the conductive post 24 to be formed penetrates through the liquid repellent portion 16. The conductive post 24 is thus electrically coupled to the wiring 14. Further, the liquid repellent portion 16 is not necessarily removed before the conductive post 24 is formed, simplifying operations and improving productivity.

Furthermore, in the embodiment, the first liquid including a liquid repellent material is applied by the droplet discharge method so as to form the liquid repellent portion 16. Therefore, an application amount and application position are precisely controllable and thus a position and size of the conductive post 24 are controllable with high accuracy.

Further, ODS is employed as the material forming the liquid repellent portion 16 in the embodiment. ODS is a silane compound that forms a self-assembled film on a disposed surface. The material forming the liquid repellent portion 16 thus sufficiently maintains liquid repellency required for the liquid material, forming the liquid repellent portion 16 in an excellent condition. Further, upon an application, ODS immediately forms a monomolecular film on the applied surface due to self assembling. A thickness of the monomolecular film is defined by a molecular structure forming the film. Therefore, based on a molecular structure of ODS to be used, the thickness of the monomolecular film to be formed is easily defined to be about several nm. Therefore, the thickness of the liquid repellent portion 16 is easily and securely made to be 100 nm or less.

In the embodiment, the material forming the insulation layer 18 is photo-curing resin. In general, photo-curing resin has less shrinkage due to curing. Therefore, the opening 19 and the conductive post 24 can be easily formed in desired shapes. Further, the resin is cured by light irradiation for a short time. Therefore, the second liquid L2 having been disposed is prevented from flowing and deforming during curing, enabling accurate control of the shape and/or size of the conductive post 24. Further, the resin is cured by the light irradiation for a short time so as to form the conductive post 24, resulting in high operation efficiency and improving productivity compared to a case of using thermosetting resin.

In the embodiment, the liquid repellent material is disposed by the droplet discharge method. However, as long as the liquid repellent portion 16 is formed to be in a desired shape, other methods such as screen printing, a dispenser method, and the like can be employed to form the liquid repellent portion 16. Further, the method to dispose the metal particulates 22A is also not limited to the droplet discharge method, but other methods can be employed as long as the opening 19 is formed as predetermined.

In the embodiment, ODS that is a silane compound forming a self-assembled film is used as the liquid repellent material. However, the liquid repellent material may be a precursor of polymer constituting the liquid repellent portion 16. As such a precursor, fluorine resin is named, for example. In this case, a step for forming the liquid repellent portion 16 preferably includes polymerizing the disposed liquid repellent material by heating. According to the method, liquid repellency is assuredly provided by polymerizing the fluorine resin by heating. Further, the thickness of the liquid repellent portion 16 to be formed is preferably controlled by an application amount and concentration of the first liquid L1 to be applied. This makes it easy to form the liquid repellent portion 16 having a desired thickness.

Second Embodiment

Next, a method for forming a conductive post according to a second embodiment will be described referring to FIGS. 7A through 8F. The method for forming a conductive post according to the second embodiment has partially in common with the method according to the first embodiment. Different points are that the metal particulates applied in accordance with a wiring pattern are heated at two steps of heating so as to form wiring, and the material forming the conductive post is disposed by a film forming process. Therefore, in the second embodiment, for components common with those of the first embodiment will be affixed with the same numerals, and detailed descriptions thereof will be omitted.

Figure 7A:
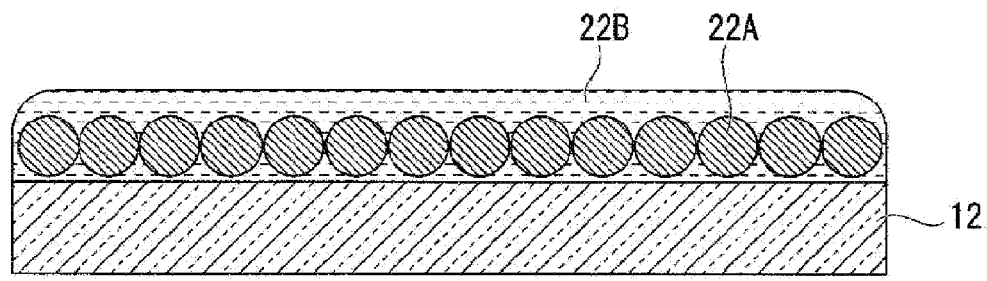
FIGS. 7A through 7C are sectional views schematically showing a state of fusion bonding of metal particulates depending on heating conditions.
Figure 7B:
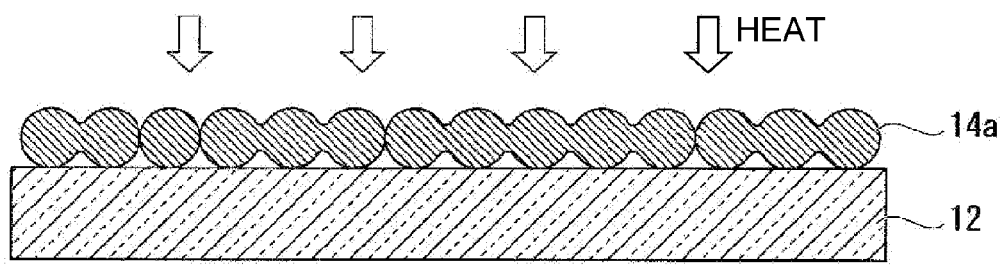
Figure 7C:
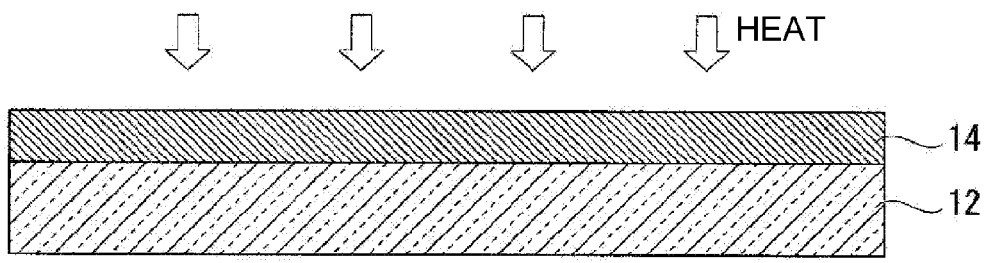

First, forming the wiring 14 in the second embodiment will be described with reference to FIGS. 7A through 7C. In the second embodiment, the metal particulates that are disposed are heated at two steps of heating so as to form wiring. The two steps of heating includes a first step to partially fusion bond the metal particulates to each other after the metal particulates are disposed in a conductive layer forming region (pre-baking), and a second step to thoroughly fusion bond the metal particulates to each other so as to be integrated after the conductive post forming material is disposed (baking). In both steps, heating is performed at a temperature higher than or equal to the fusing temperature of the metal particulates. FIGS. 7A through 7C are sectional views schematically showing the wiring 14 formed from the metal particulates subjected to heating. FIG. 7A shows a view before heat application, and FIG. 7B shows a view after pre-baking, while FIG. 7C shows a view after baking.

As shown in FIG. 7A, when the third liquid L3 is applied to the substrate 12 in a predetermined pattern, the metal particulates 22A are disposed on the substrate 12. The third liquid L3 includes the metal particulates 22A and the dispersion medium 22B.

When pre-baking is performed, as shown in FIG. 7B, the dispersion medium 22B included in the third liquid L3 evaporates, and the coating material (not illustrated) coating the metal particulates 22A is removed. Concurrently, the metal particulates 22A partially fuse and partially fusion bond to each other so as to form preliminary wiring (metal particulate layer) 14a. The preliminary wiring 14a is not in a state that the metal particulates are thoroughly integrated. Therefore, the preliminary wiring 14a may include some metal particulates which have not fusion bonded to each other in places. However, the dispersion medium 22B is evaporated, and the metal particulates 22A fusion bond to each other at a certain degree to obtain electrical conduction. Therefore, the preliminary wiring 14a is not easily deformed, but stably settled in a disposed surface. The pre-baking is performed at 120 degrees Celsius for 60 minutes.

When baking is subsequently performed, as shown in FIG. 7C, the preliminary wiring 14a further fusion bonds to each other, thereby forming the wiring 14 that is thoroughly integrated. The baking is performed at 180 degrees Celsius for 60 minutes. A difference from the pre-baking is the heating temperature.

Here, as a way to know whether the metal particulates 22A after heating forms the wiring 14 or not, for example, conductivity is compared as an index. If conductivity of the preliminary wiring 14a described above is compared to conductivity of the wiring 14, the wiring 14 shows high conductivity. This is because, in the preliminary wiring 14a, the metal particulates have not thoroughly fused to be integrated, and thus some portions having a small conductive sectional area and high resistance are included. Therefore advance research in relation between heating conditions and conductivity enables appropriate setting for conditions of the pre-baking and baking.

Further, as control methods for process conditions, a method for controlling a heating temperature, and a method for controlling processing time are considered. In the second embodiment, the heating temperature is controlled so that the pre-baking is performed at a lower temperature such as 120 degrees Celsius than the baking. As another method, it is considered that the pre-baking is performed at the same temperature of the baking, but the processing time is shorter, that is, at 180 degrees Celsius for 15 minutes, for example. In either method, fusing of the metal particulates 22A is controlled by changing a thermal history of the metal particulates 22A, thereby easily forming the preliminary wiring 14a. Further, both the heating temperature and the heating time may be controlled so as to control the pre-baking.

Based on the above, the method for forming a conductive post according to the second embodiment will now be described with reference to FIGS. 8A through 8F. FIGS. 8A through 8F show process diagrams illustrating the method for forming a conductive post according to the second embodiment.

As shown in FIG. 8A, the third liquid L3 is applied to the substrate 12 in a predetermined pattern from the droplet discharge head 301. After the application, the metal particulates 22A are disposed on the substrate 12 in a predetermined pattern.

Then, as shown in FIG. 8B, the substrate 12 having the third liquid L3 applied thereon is heated in the conditions of the heating (pre-baking) as described above (pre-baking step) so as to form the preliminary wiring 14a.

Then, as shown in FIG. 8C, the first liquid L1 is applied to the conductive post forming region of the preliminary wiring 14a from the droplet discharge head 301 so as to form the liquid repellent portion 16. In the second embodiment, ODS that forms a self-assembled film is used as the liquid repellent material. Therefore, the liquid repellent portion 16 immediately showing liquid repellency in a region where the first liquid L1 is disposed is formed. The thickness of the liquid repellent portion 16 is only several nm.

Next, as shown in FIG. 8D, the second liquid L2 is applied to the region where the liquid repellent portion 16 is not formed on the preliminary wiring 14a from the droplet discharge head 301 and irradiated with ultraviolet rays (not illustrated). The insulation layer 18 having the opening 19 at the conductive post forming region is thus formed.

Referring now to FIG. 8E, a conductive post forming material is deposited in the opening 19, so that the conductive post forming material is disposed. The deposition is performed with a method that is normally employed, such as vapor deposition, sputtering, or the like. The conductive post forming material that is disposed forms the upper plug 24A of the conductive post, and overlaps with the preliminary wiring 14a through the liquid repellent portion 16 therebetween.

Then, as shown in FIG. 8F, the whole of the substrate 12 is heated so as to heat the preliminary wiring 14a disposed on the substrate 12 in the conditions of the heating (baking) as described above (baking step), forming the wiring 14. Since the whole of the substrate 12 is heated, the preliminary wiring 14a further goes on fusion bonding to each other, thereby forming the wiring 14. At this time, the thickness of the liquid repellent potion 16 is extremely thin such as several nm only. Therefore, when the heating is performed at the temperature for the baking, the preliminary wiring 14a overlapping with the liquid repellent portion 16 further goes on fusing and fusion bonding while the liquid repellent portion 16 is partially decomposed. Consequently, the preliminary wiring 14a in the region overlapping with the liquid repellent portion 16 penetrates through the liquid repellent portion 16, thus forming the lower plug 24B coupled to the upper plug 24A. The upper plug 24A and the lower plug 24B form the conductive post 24 as a whole. Therefore, the conductive post 24 is coupled to the wiring 14. Through the above, the conductive post 24 electrically coupled to the wiring 14 is completed.

According to the method for forming the conductive post 24 having the structure described above, the conductive post 24 can be positioned with high accuracy due to liquid repellency of the liquid repellent portion 16. Further, the metal particulates 22A are used as a material forming the wiring 14, and the thickness of the liquid repellent portion is to be at 100 nm or less, resulting in secure conduction of the conductive post 24 and the wiring 14. Furthermore, the liquid repellent portion 16 is not necessarily removed before the conductive post 24 is formed, simplifying operations and improving productivity.

Further, in the second embodiment, the pre-baking step is performed so as to form the preliminary wiring 14a formed by partially fusion bonding the metal particulates 22A. Since the metal particulates 22A partially fusion bond to each other, the metal particulates 22A can be settled where they are disposed, facilitating successive steps and securely forming the conductive post 24.

In the step in which the third liquid L3 is applied to the substrate 12 from the droplet discharge head 301 so as to form the metal particulate layer, a second liquid repellent portion may be formed by disposing the liquid repellent material around the conductive layer forming region, and then the third liquid L3 may be applied to a region surrounded by the second liquid repellent portion. That is, as shown in FIG. 4, the liquid repellent material is first disposed around the conductive layer forming region that is subjected to application so as to form the second liquid repellent portion. Then, the third liquid L3 may be applied to the region surrounded by the second liquid repellent portion so as to perform application of the third liquid L3. Here, the liquid repellent material is preferably disposed by the droplet discharge method so as to form the second liquid repellent portion having a fine pattern. However, other methods such as screen printing, a dispenser method, or the like may be employed to dispose the liquid repellent material. The liquid repellent material may be either the same or different from the liquid repellent material forming the liquid repellent portion 16.

In such an application method, a negative pattern of a predetermined wiring pattern needs to be formed first by the liquid repellent portion for wiring to be formed. Then, the third liquid L3 is applied to a wiring forming surface having a relatively lyophilic property. Therefore, the third liquid L3 that is repelled by the second liquid repellent portion is disposed exactly in the predetermined wiring pattern with high accuracy, forming preliminary wiring 14a with high accuracy. Therefore, the preliminary wiring 14a accurately formed is coupled to the conductive post 24.

Third Embodiment

Figure 9A:
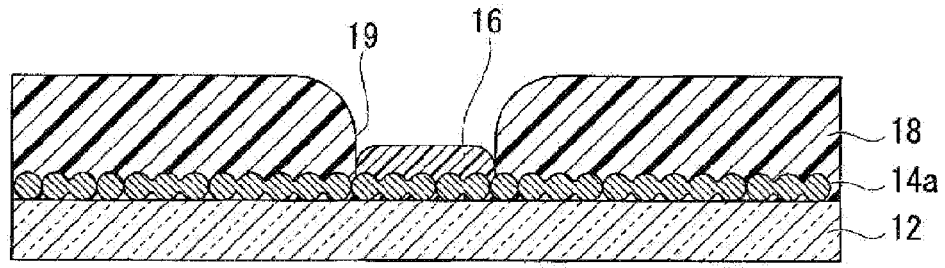
FIGS. 9A through 9C are process diagrams showing a method for forming a conductive post according to a third embodiment.
Figure 9B:
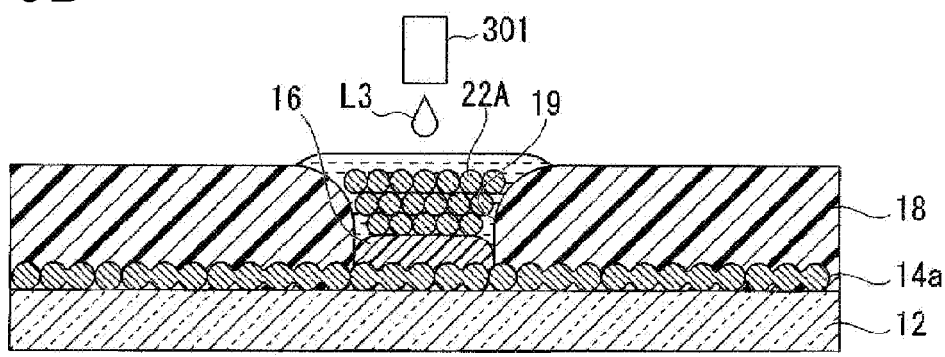
Figure 9C:
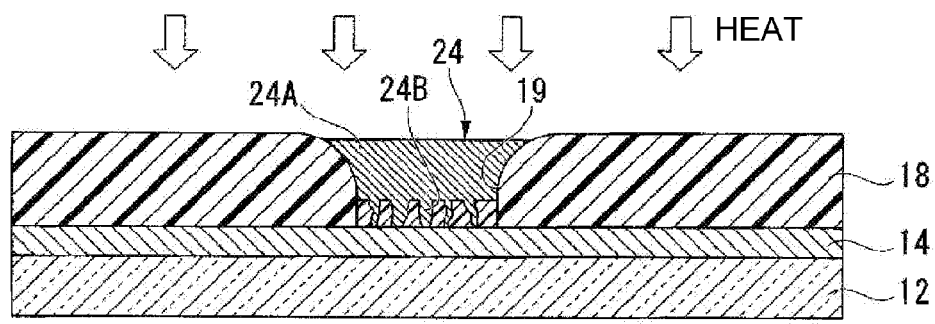

FIGS. 9A through 9C are explanatory diagrams showing a method for forming a conductive post according to a third embodiment. The method for forming a conductive post according to the third embodiment has partially in common with the methods according to the first embodiment and the second embodiment. A different point is that wiring coupled to a conductive post and the conductive post are formed from metal particulates. Therefore, in the third embodiment, for components common with those of the first embodiment and the second embodiment will be affixed with the same numerals, and detailed descriptions thereof will be omitted.

FIGS. 9A through 9C show sectional process diagrams illustrating the method for forming a conductive post according to the third embodiment. As shown in FIG. 9A, in accordance with the method described in the second embodiment, the preliminary wiring 14a on the substrate 12, the liquid repellent portion 16 disposed in the conductive post forming region on the preliminary wiring 14a, and the insulation layer 18 having the opening 19 formed in the region overlapping with the liquid repellent portion 16 are formed. The thickness of the liquid repellent portion 16 is only several nm. FIG. 9A is a diagram corresponding to FIG. 8D that is used in the description of the second embodiment.

Then, as shown in FIG. 9B, the third liquid L3 is applied to the opening 19 from the droplet discharge head 301 so as to dispose the metal particulates 22A and the dispersion medium 22B in the opening 19.

Then, as shown in FIG. 9C, the whole of the substrate 12 is heated so as to heat the preliminary wiring 14a disposed on the substrate 12, and the metal particulates 22A disposed in the opening 19 in the conditions described above as the baking step. The preliminary wiring 14a further goes on fusing and fusion bonding to each other due to the heating, thereby forming the wiring 14. Concurrently, while the liquid repellent portion 16 is partially decomposed, the preliminary wiring 14a goes on fusing and fusion bonding at a lower surface of the liquid repellent portion 16, and the metal particulates 22A go on fusing and fusion bonding at an upper surface of the liquid repellent portion 16. Consequently, the lower plug 24B penetrating through the liquid repellent portion 16 and coupled to the wiring 24A is formed. The upper plug 24A and the lower plug 24B form the conductive post 24 as a whole. Therefore, the conductive post 24 is coupled to the wiring 14. Through the above, the conductive post 24 electrically coupled to the wiring 14 is completed.

According to the method for forming the conductive post 24 having the structure described above, fusing and fusion bonding progress in both the metal particulates 22A forming the preliminary wiring 14a and the metal particulates 22A disposed in the conductive post forming region in the baking. Therefore, the metal particulates 22A to grow can more easily penetrate through the liquid repellent portion 16. Thus conduction is more assuredly obtained, and the conductive post 24 is more easily formed.

[Multilayered Wiring Substrate]

Figure 10:
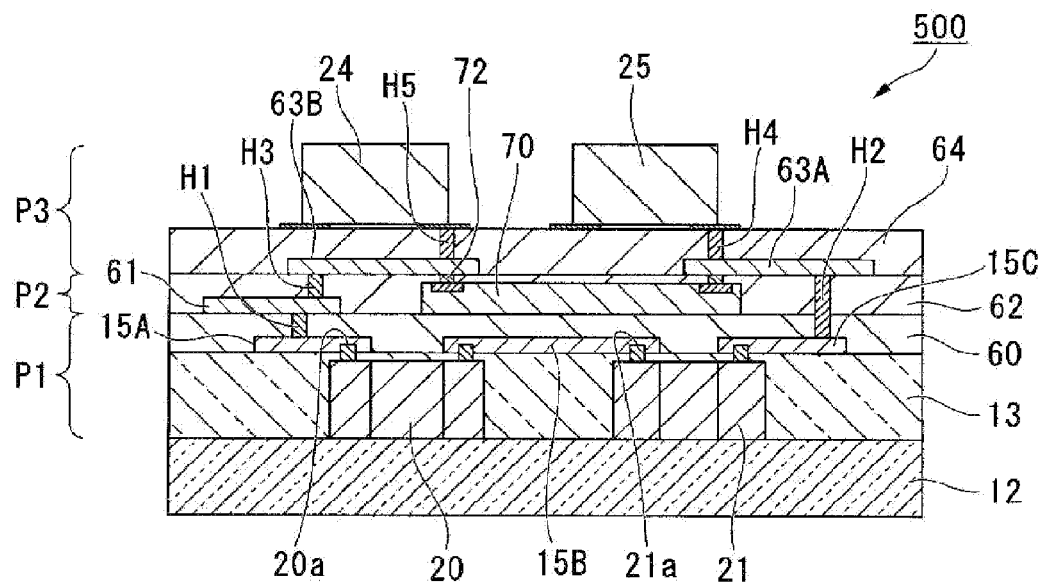
FIG. 10 is a sectional view showing a multilayered wiring substrate.

Now an example of a multilayered wiring substrate manufactured by employing the method for forming a conductive post as described above will be described with reference to FIG. 10. Here, a multilayered wiring substrate 500 mounted on a cellar phone is exemplified to explain. The multilayered wiring substrate 500 shown in FIG. 10 is formed from three wiring layers P1, P2, and P3 layered on the substrate 12 made of silicon oxide. In the description below, a layered direction of the wiring layers is referred to as an upper direction while a direction in which the substrate 12 is positioned is referred to as a lower direction for indicating a relation of ups and downs of component members.

Examples of a material of the substrate 12 include various materials such as glass, quartz glass, and a metal plate. Such examples also includes the above material substrates provided with a semiconductor film, a metal film, an insulation film, or an organic film formed on their surfaces as a base layer.

The wiring layer P1 is provided with an insulation layer 13 formed on the substrate 12, a resistor 20 and condenser 21 mounted on the substrate 12 so as to be buried in the insulation layer 13, wiring 15A, 15B, and 15C that are coupled to the resistor 20 and the condenser 21, and a first interlayer insulation film (insulation layer) 60 formed on the insulation layer 13 so as to cover each wiring.

The resistor 20 disposed on the substrate 12 is provided with two electrode portions 20a. The electrode portions 20a are formed on an upper surface of the resistor 20. Further, the condenser 21 disposed on the substrate 12 similarly to the resistor 20 is provided with two electrode portions 21a that are also formed on an upper surface of the condenser 21.

Practically, the electrode portions 20a and 21a are formed so as almost not to protrude from the upper surfaces of the resistor 20 and the condenser 21. However, the electrode portions 20a and 21a are illustrated as protrusions here. Alternatively, the electrode portions 20a and 21a can actually form protrusions by discharging a conductive material with a droplet discharge method or the like.

At a periphery and the upper surface of the resistor 20 and condenser 21 on an upper surface of the substrate 12, the insulation layer 13 is formed. The insulation layer 13 is formed by applying a liquid including a photo-curing insulation layer forming material with the droplet discharge method described above, and then polymerizing and curing the insulation layer forming material.

On an upper surface of the insulation layer 13, the wiring 15A, 15B, and 15C are formed. Each of the wiring is formed by applying a functional liquid including a conductive material with the droplet discharge method described above. In the third embodiment, a functional liquid containing silver particulates is used as the conductive material. Among the wiring described above, the wiring 15B has one end coupled to one of the electrode portions 20a, and the other end coupled to one of the electrode portions 21a so as to electrically couple the resistor 20 with the condenser 21. Further, the wiring 15A is coupled to the other one of the electrode portions 20a, while the wiring 15C is coupled to the other one of the electrode portions 21a.

On the upper surface of the insulation layer 13, the first interlayer insulation film 60 is formed so as to cover the wiring 15A, 15B, and 15C. The first interlayer insulation film 60 is formed similarly to the insulation layer 13 by disposing a photo-curing insulation layer forming material with the droplet discharge method followed by curing.

In the first interlayer insulation film 60, a first conductive post H1 coupled to the wiring 15A, and a second conductive post H2 coupled to the wiring 15C are formed. Each of the conductive posts as above is made of the same material as that of the wiring.

The wiring layer P2 is provided with a semiconductor chip 70 disposed on the first interlayer insulation film 60, wiring 61 similarly disposed on the first interlayer insulation film 60, and a second interlayer insulation film 62 formed on the first interlayer insulation film 60 so as to cover the semiconductor chip 70 and the wiring 61. The semiconductor chip 70 formed on the first interlayer insulation film 60 is provided with terminals 72 for external connection on its upper surface.

The wiring 61 formed on the first interlayer insulation film 60 is coupled to the first conductive post H1. The wiring 61 is formed by applying a conductive material with the droplet discharge device similarly to the wiring 15A, 15B, and 15C. Further, the wiring 61 is made of the same material as that of the wiring 15A, 15B, and 15C.

On an upper surface of the first interlayer insulation layer 60, the second interlayer insulation film 62 is formed so as to cover the wiring 61 and the semiconductor chip 70. The second interlayer insulation film 62 is formed similarly to the insulation layer 13 and the first inter layer insulation film 60 by disposing a photo-curing insulation layer forming material with the droplet discharge method followed by curing.

In the second interlayer insulation film 62, a third conductive post H3 coupled to the wiring 61 by penetrating through the second interlayer insulation film 62, and a part of the second conductive post H2 by similarly penetrating through the second interlayer insulation film 62 as described above are formed. Each of the conductive posts as above is made of the same material as that of the wiring.

The wiring layer P3 is provided with wiring 63A and 63B that are formed on the second interlayer insulation film 62, a third interlayer insulation film 64 formed on the second interlayer insulation film 62 so as to cover the wiring 63A and 63B, an antenna element 24 and a crystal resonator 25 that are disposed on the third interlayer insulation film 64.

The wiring 63A formed on the second interlayer insulation film 62 is coupled to the wiring 15C through the second conductive post H2. Further, the wiring 63A is coupled to one of the terminals 72 provided on the semiconductor chip 70. Therefore, the semiconductor chip 70 is coupled to the condenser 21 through the wiring 63A, the second conductive post H2, and the wiring 15C.

Further, the wiring 63B formed on the second interlayer insulation film 62 is coupled to the wiring 61 through the third conductive post H3. Furthermore, the wiring 63B is coupled to the other one of the terminals 72 provided on the semiconductor chip 70. Therefore, the semiconductor chip 70 is coupled to the resistor 20 through the wiring 63B, the third conductive post H3, the wiring 61, and the first conductive post H1.

The wiring 63A and 63B is formed by applying a conductive material with the droplet discharge device described above, and made of the same material as that of the wiring 15A, 15B, 15C and 61.

In the third interlayer insulation film 64, a fourth conductive post H4 and a fifth conductive post H5 are formed. The fourth conductive post H4 penetrates through the third conductive layer 64 so as to couple the wiring 63A with the crystal resonator 25, while the fifth conductive post H5 similarly penetrates through the second interlayer insulation film 62 so as to couple the wiring 63B with the antenna element 24. Each of the conductive posts as above is made of the same material as that of the wiring.

The conductive posts H1 to H5 of the multilayered wiring substrate 500 as the above are formed by employing the method for forming a conductive post described above. Therefore, the multilayered wiring substrate 500 having the conductive posts formed in accurate positions is provided.

[Electronic Apparatus]

Figure 11:
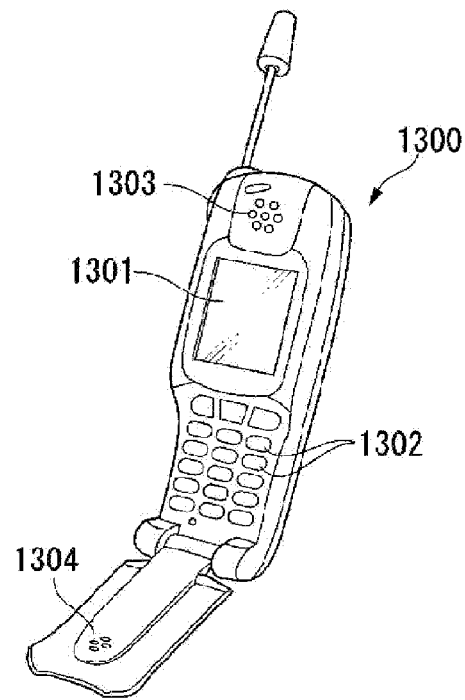
FIG. 11 is a perspective view of an example of an electronic apparatus.

FIG. 11 is a perspective view showing a structure of a cellular phone as an example of an electronic apparatus manufactured by employing a multilayered wiring substrate according to the invention. A process for manufacturing a cellar phone 1300 includes a process for manufacturing the multilayered wiring substrate described above. This cellular phone 1300 includes a display 1301 that is a small size liquid crystal display device of the invention, a plurality of operation buttons 1302, an ear piece 1303, and a mouthpiece 1304.

The cellar phone 1300 is manufactured by a process for manufacturing a multilayered wiring substrate having a minute conductive post coupling between layers, enabling a substrate to be highly dense and thus manufacturing the cellar phone 1300 that is successfully down-sized.

The process for manufacturing the multilayered wiring substrate above can be preferably employed not only for the process for manufacturing the cellular phone 1300 described above but also for a manufacturing process of the following electronic apparatuses: electronic books; personal computers; digital still cameras; liquid crystal display televisions; projectors; video tape recorders of viewfinder type or monitor direct-viewing type; car navigation devices; pagers; electronic notebooks; electric calculators; word processors; work stations; picture phones; POS terminals; apparatuses equipped with a touch panel, and so on. Devices can successfully be down sized by employing a highly dense wiring substrate, and further electronic apparatuses provided with calculation ability showing high performance can be manufactured by employing a highly integrated wiring substrate.

While the embodiments according to the invention have been described with reference to the accompanied drawings, it is needless to say that the invention is not limited to the above embodiments. The shapes, combinations or the like of the components described in the above embodiments are presented by way of example. Therefore, various modifications can be made in accordance with design requirements or the like, without departing from the spirit and scope of the invention.

WORKING EXAMPLES

Results of an evaluation on a thickness of a liquid repellent portion to be formed with respect to conduction of a conductive post will be described as a working example of the invention. In the example, samples formed with liquid repellent portions having variable thicknesses were prepared and evaluated by forming a conductive post on wiring according to the method in the first embodiment. Further, in the example, fluorine resin was used as a liquid repellent material, and the samples with liquid repellent portions having variable thicknesses were prepared by changing a concentration and an application amount of a liquid including the liquid repellent material to be applied.

FIG. 12 is a table showing results of the evaluation on conduction between the conductive post and the wiring with respect to the thickness of the liquid repellent portion. In FIG. 12, symbols O indicate results in which the conduction between the conductive post having been formed and the wiring was obtained, while symbols X indicate results in which the conduction was not confirmed.

As a result of the evaluation, it was found that the conduction was obtained up to when the thickness of the liquid repellent portion was 100 nm, while the conduction was not obtained in a case where the conductive post was formed on the wiring through the liquid repellent portion formed therebetween and having the thickness exceeding 100 nm. Accordingly, effectiveness of the invention was confirmed.

What is claimed is:

1. A method for forming a conductive post, comprising:
   a) forming a liquid repellent portion having a thickness of 100 nm or less by disposing a liquid repellent material in a conductive post forming region on a conductive layer;
   b) forming an insulation layer having an opening in a region overlapping with the conductive post forming region by disposing a liquid including an insulation layer forming material on the conductive layer having the liquid repellent portion formed thereon and polymerizing the insulation layer forming material;
   c) disposing metal particulates in the opening; and
   d) heating the metal particulates at a fusing temperature of the metal particulates or higher so as to fusion bond the metal particulates to each other in order to form the conductive post, and to fusion bond the metal particulates and the conductive layer in order to couple the conductive post with the conductive layer.

2. The method for forming a conductive post according to claim 1, wherein the liquid repellent portion is formed by applying a liquid including the liquid repellent material with a droplet discharge method.

3. The method for forming a conductive post according to claim 1, wherein the liquid repellent material includes at least one of a silane compound and a compound including a fluoroalkyl group.

4. The method for forming a conductive post according to claim 3, wherein the liquid repellent material forms a self-assembled film on a surface where the liquid repellent material is disposed.

5. The method for forming a conductive post according to claim 3, wherein the liquid repellent material is a precursor of polymer constituting the liquid repellent portion, and step a) includes polymerizing the liquid repellent material by heating.

6. The method for forming a conductive post according to claim 1, wherein the insulation layer forming material is photo-curing resin.

7. A method for forming a multilayered wiring substrate, comprising:
    forming a second conductive layer on the insulation layer; and
    electrically coupling the conductive layer with the second conductive layer through a conductive post formed by the method for forming a conductive post according to claim 1.

8. A method for manufacturing an electronic apparatus, comprising: mounting the multilayered wiring substrate according to claim 7 into a housing of an electronic device.

9. A method for forming a conductive post, comprising:
    e) forming a metal particulate layer made of metal particulates by disposing the metal particulates in a conductive layer forming region that forms a conductive layer;
    f) forming a liquid repellent portion having a thickness of 100 nm or less by disposing a liquid repellent material in a conductive post forming region on the metal particulate layer;
    g) forming an insulation layer having an opening in a region overlapping with the conductive post forming region by disposing a liquid including an insulation layer forming material on the metal particulate layer having the liquid repellent portion formed thereon and polymerizing the insulation layer forming material;
    h) disposing a conductive post forming material in the opening;
    i) heating the metal particulate layer at a fusing temperature of the metal particulates or higher so as to fusion bond the metal particulates to each other in order to form the conductive layer, and to fusion bond the metal particulates and the conductive post forming material in order to couple the conductive layer with the conductive post.

10. The method for forming a conductive post according to claim 9, wherein the conductive post forming material includes same metal particulates as the metal particulates constituting the metal particulate layer, and the metal particulate layer and the conductive post forming material are heated at the fusing temperature of the metal particulates or higher so as to fusion bond the metal particulates serving as the conductive post forming material to each other in order to form the conductive post, and to fusion bond the metal particulates included in the metal particulate layer and the conductive post forming material in order to couple the conductive layer with the conductive post.

11. The method for forming a conductive post according to claim 9, wherein step e) includes:
    j) forming a second liquid repellent portion by disposing a liquid repellent material around the conductive layer forming region; and
    k) disposing a liquid including the metal particulates in a region surrounded by the second liquid repellent portion.

12. The method for forming a conductive post according to claim 11, wherein the second liquid repellent portion is formed by applying a liquid including the liquid repellent material with a droplet discharge method.

13. The method for forming a conductive post according to claim 11, wherein the second liquid repellent material is a precursor of polymer constituting the liquid repellent portion, and step j) includes polymerizing the liquid repellent material by heating.

14. The method for forming a conductive post according to claim 9, wherein step e) includes disposing a liquid including the metal particulates and heating the metal particulates serving as a material forming the metal particulate layer at the fusing temperature of the metal particulates or higher so as to partially fusion bond the metal particulates to each other.

* * * * *